United States Patent
Tagome

(10) Patent No.: US 7,821,306 B2
(45) Date of Patent: Oct. 26, 2010

(54) SWITCHING DEVICE DRIVE CIRCUIT

(75) Inventor: Masaki Tagome, Osaka (JP)

(73) Assignee: Panasonic Corporation, Osaka (JP)

( * ) Notice: Subject to any disclaimer, the term of this patent is extended or adjusted under 35 U.S.C. 154(b) by 136 days.

(21) Appl. No.: 12/376,493

(22) PCT Filed: Jun. 19, 2008

(86) PCT No.: PCT/JP2008/001587

§ 371 (c)(1),
(2), (4) Date: Feb. 5, 2009

(87) PCT Pub. No.: WO2008/155917

PCT Pub. Date: Dec. 24, 2008

(65) Prior Publication Data

US 2010/0176783 A1    Jul. 15, 2010

(30) Foreign Application Priority Data

Jun. 19, 2007    (JP)    ............................. 2007-161648

(51) Int. Cl.
H03B 1/00    (2006.01)

(52) U.S. Cl. .................. 327/109; 327/112; 327/108

(58) Field of Classification Search .............. 327/108, 327/109, 112, 427, 434
See application file for complete search history.

(56) References Cited

U.S. PATENT DOCUMENTS

| | | | |
|---|---|---|---|
| 5,986,484 A | 11/1999 | Kimata | |
| 6,970,023 B2 * | 11/2005 | Fedigan | 327/109 |
| 7,459,945 B2 * | 12/2008 | Omura | 327/108 |
| 7,528,637 B2 * | 5/2009 | Matsumoto et al. | 327/112 |
| 7,710,167 B2 * | 5/2010 | Bernacchia | 327/108 |
| 2007/0008679 A1 | 1/2007 | Takahasi et al. | |

FOREIGN PATENT DOCUMENTS

| | | |
|---|---|---|
| JP | 09-023664 | 1/1997 |
| JP | 10-023743 | 1/1998 |
| JP | 10-032976 | 2/1998 |
| JP | 2001-268926 | 9/2001 |
| JP | 2001-352748 | 12/2001 |
| JP | 2004-266368 | 9/2004 |
| JP | 2005-354763 | 12/2005 |

* cited by examiner

Primary Examiner—Hai L Nguyen
(74) Attorney, Agent, or Firm—McDermott Will & Emery LLP

(57) ABSTRACT

A gate voltage detecting circuit 201 detects a gate voltage Vgs of a switching device 11, and when the gate voltage is less than a predetermined voltage that is set to be less than a threshold voltage of the switching device 11, outputs an H-level boost instruction signal. A voltage control circuit 103, when the boost instruction signal is at the L level, outputs a predetermined voltage V1 of a control power supply 102 as it is, and when the boost instruction signal is at the H level, outputs a voltage V2 obtained by boosting the predetermined voltage V1. The drive signal output circuit 104 amplifies a voltage of a PWM pulse output from a PWM pulse output circuit 111 to a voltage output from the voltage control circuit 103. Therefore, a drive signal from the drive signal output circuit 104 to the switching device 11 initially becomes the boosted voltage V2 when the PWM pulse goes to the H level, and then becomes the predetermined voltage V1 when the gate voltage Vgs of the switching device 11 increases to a predetermined voltage. Therefore, a switching loss of the switching device can be suppressed.

19 Claims, 21 Drawing Sheets

FIG. 7
(a)
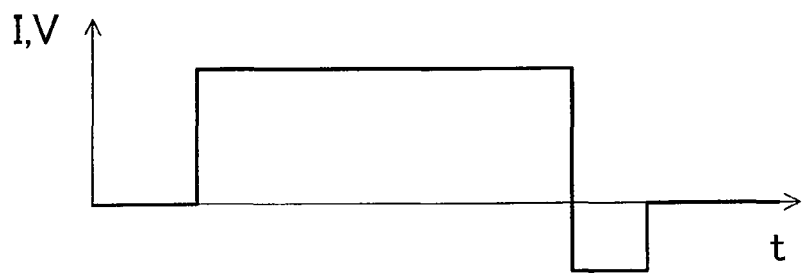
(b)
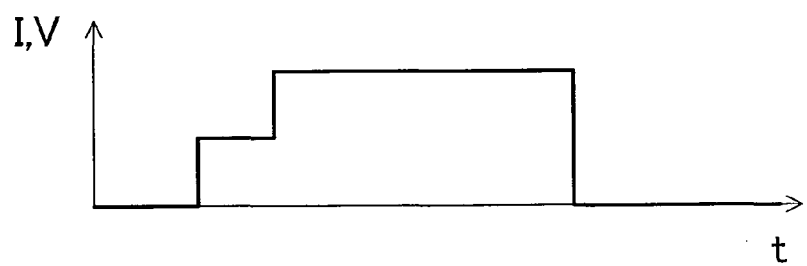
(c)
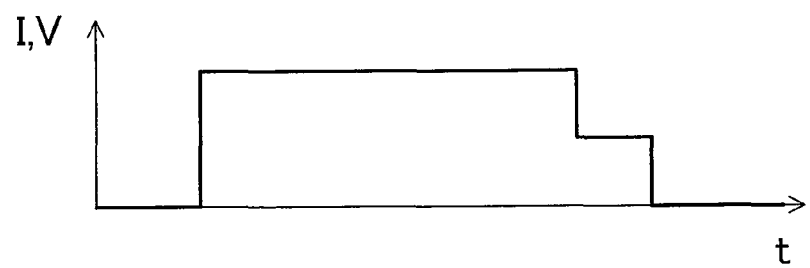

SWITCHING DEVICE DRIVE CIRCUIT

RELATED APPLICATIONS

This application is the U.S. National Phase under 35 U.S.C. §371 of International Application No. PCT/JP2008/001587, filed on Jun. 19, 2008, which in turn claims the benefit of Japanese Application No. 2007-161648, filed on Jun. 19, 2007, the disclosures of which Applications are incorporated by reference herein.

TECHNICAL FIELD

The present invention relates to a switching device drive circuit for driving a switching device, such as an IGBT, a MOSFET or the like, for switching large power.

BACKGROUND ART

In recent years, a motor has been employed not only in trains but also in cars. For example, a hybrid car, which has attracted attention because of its capability of reducing exhaust gas and preventing environmental pollution and has been commercialized, is driven by a gasoline engine and a motor as power sources. A voltage supplied to such a motor for cars is conventionally about 200 V to 300 V. In recent years, however, the supply voltage has been increased so as to enhance the accelerating force for cars. It is expected that a supply voltage of as high as about 500 V to 1000 V will be mainstream in the future.

To cause a battery to generate the same voltage as the supply voltage, a considerably large number of unit batteries need to be connected in series, leading to a large size of the whole battery. Therefore, for example, a technique of providing a boost chopper circuit in a voltage converting device or the like to boost a direct-current voltage obtained from a battery, has been employed (see, for example, Patent Document 1).

The boost chopper circuit comprises a reactor L, a capacitor C, and a switching device capable of switching large power, such as an insulated gate bipolar transistor (IGBT) or the like. The switching device is driven by a drive signal of about 20 kHz or less output from a switching device drive circuit based on a pulse signal, for example. The boost voltage is controlled based on a pulse width (duty ratio) of the pulse signal.

Also, when the boost chopper circuit is used, protection against overcurrent during the start of a motor or the like is facilitated by a known technique of allowing a switching device to perform a gentle switching operation by increasing the gate resistance of the switching device or reducing the gate voltage (see, for example, Patent Document 2).

There is also a technique of driving a switching device, in which an operation state of the switching device is detected, and the switching device is controlled, depending on the detected operation state. Hereinafter, these techniques will be described with reference to Patent Documents 3 and 4.

Examples of a switching device that performs a switching operation based on a pulse signal (generally called PWM drive) include a field effect transistor (hereinafter referred to as a MOSFET), an insulated gate bipolar transistor (hereinafter referred to as an IGBT), and the like. These switching devices are characterized by a relatively high switching operation speed, and are widely employed so as to achieve a high-frequency inverter and converter. In recent years, the voltage, current and speed of these switching devices have been rapidly increased, but conversely, the high-frequency and high-speed switching operation causes a surge voltage that may break down the switching device or generate noise that interferes with other electronic devices.

Here, the configuration of a general switching device drive circuit is shown in FIG. 20. In FIG. 20, the output of a PWM signal circuit 3 is connected to the input of a switching device drive circuit 200, and the output of the switching device drive circuit 200 is connected to the control terminal of a voltage drive switching device 1. The switching device drive circuit 200 comprises a drive signal output circuit 400, an ON-control voltage circuit 500, an OFF-control voltage circuit 600, and a control resistor 700. The ON-control voltage circuit 500 and the OFF-control voltage circuit 600 output constant voltages sufficient to turn ON and OFF the voltage drive switching device 1, respectively. The drive signal output circuit 400 is operated in synchronization with a PWM signal output from the PWM signal circuit 3, and outputs a power-amplified signal via the control resistor 700 to the control terminal of the voltage drive switching device 1.

Next, operation waveforms of the switching device drive circuit 200 and the voltage drive switching device 1 of FIG. 20 are shown in FIG. 21. In FIG. 21, a PWM signal, a drive signal, an ON-control voltage, an OFF-control voltage, a drain current, and a drain voltage are an output signal of the PWM signal circuit 3, an output signal of the switching device drive circuit 200, an output voltage of the ON-control voltage circuit 500, an output voltage of the OFF-control voltage circuit 600, and a drain voltage and a drain current of the voltage drive switching device 1, respectively.

Initially, the PWM signal circuit 3 outputs the PWM signal for turning ON/OFF the voltage drive switching device 1. The PWM signal is instantaneously switched from the Low level to the High level at time t1 in FIG. 21, and from the High level to the Low level at time t5. Next, the switching device drive circuit 200 power-amplifies the PWM signal, and inputs the resultant signal as a drive signal to the control terminal of the voltage drive switching device 1. The drive signal and the PWM signal are synchronous.

An operation of turning ON the voltage drive switching device 1 will be described in detail. Although the PWM signal goes to the High level at time t1, the rising of the drive signal is delayed to time t2 due to a delay caused by a circuit in the switching device drive circuit 200 or a current limitation caused by the control resistor. From time t2, charging of a gate-source capacitance (not shown) of the voltage drive switching device 1 is started, so that the drive signal (i.e., the voltage of the control terminal) gradually increases. At time t3, the voltage drive switching device 1 reaches its threshold voltage, so that the voltage drive switching device 1 is turned ON, thereby starting charging of a drain-gate capacitance (not shown) in addition to the gate-source capacitance of the switching device 1. By this operation, the drive signal is clamped in the vicinity of the threshold voltage (this operation is called a mirror effect during turning ON; from time t3 to time t4 in FIG. 21). When charging is substantially completed, the drive signal gradually increases again from time t4 and then reaches an ON-control voltage that is output by the ON-control voltage circuit 500, and ends the turning-ON operation. In the voltage drive switching device 1, a drain current starts flowing from time t3 and a drain current flows at time t4.

Next, an operation of turning OFF the voltage drive switching device 1 will be described in detail. At time t5, the PWM signal goes to the Low level, but as in the turning-ON operation, the falling of the drive signal is delayed to time t6 due to a delay caused by a circuit in the switching device drive circuit 200 or a current limitation caused by the control resistor. From time t6, discharging is started from the gate-source capacitance and the drain-gate capacitance of the voltage drive switching device 1, so that the drive signal (i.e., the voltage of the control terminal) gradually decreases. At time t7, the drive signal reaches the threshold voltage of the voltage drive switching device 1, so that the voltage drive switching device 1 is turned OFF, and only the gate-source capacitance continues to be discharged. By this operation, also as in the turning-ON operation, the drive signal is clamped in the vicinity of the threshold voltage (this operation is called a mirror effect during turning OFF; from time t7 to time t8 in FIG. 21). When discharging is substantially completed, the drive signal gradually decreases again from time t8 and then reaches the OFF-control voltage output by the OFF-control voltage circuit 600, and ends the turning-OFF operation. In the voltage drive switching device 1, the drain voltage starts increasing from time t7, and then reaches a desired drain voltage at time t8.

Here, when the change rate of the drain current (di/dt) and the change rate of the drain voltage (dv/dt) are steep, a surge current and a surge voltage occur as shown in portions A and B, respectively, disadvantageously leading to breakdown of the switching device or an interference with other electronic devices due to noise.

To solve these problems, a technique of reducing the operating speed of a switching device by changing the amounts of currents flowing into and out of the control terminal of the switching device, depending on the operation state of the switching device, has been conventionally proposed.

According to Patent Document 3, an IGBT is provided with a main emitter terminal through which a collector current mainly flows, and an auxiliary emitter terminal through which a small auxiliary emitter current proportional to the main collector current is extracted. The main emitter terminal and the auxiliary emitter terminal are connected together via an inductance. Thereby, the starting time of rising of the main collector current is detected, and the amount of a current flowing into the control terminal of the switching device is reduced and changed between before and after the main collector current flows out. As a result, the current change rate (di/dt) of the main collector current can be caused to be gentle. A reduction in current change rate (di/dt) of the main collector current leads to a reduction in voltage change rate (dv/dt) of the main collector voltage. Thus, the surge voltage and the switching noise can be suppressed.

According to Patent Document 4, the control circuit of the switching device included in an inverter comprises a voltage detecting unit for detecting the voltage of a direct-current power supply supplied to the inverter. The amount of a current flowing into the control terminal of the switching device is changed so that the operating speed of the switching device varies depending on the detected voltage. Thereby, when the voltage of the direct-current power supply is low, the value of a surge voltage due to the switching operation is also low along with the voltage of the direct-current power supply, so that the operating speed of the switching device can be increased. Therefore, when the voltage of the direct-current power supply is low, a switching loss due to the switching operation can be reduced without occurrence of an excessive surge voltage.

Patent Document 1: Japanese Unexamined Patent Application Publication No. 2005-354763

Patent Document 2: Japanese Unexamined Patent Application Publication No. 2001-268926

Patent Document 3: Japanese Unexamined Patent Application Publication No. H10-32976

Patent Document 4: Japanese Unexamined Patent Application Publication No H09-23664

DISCLOSURE OF THE INVENTION

Problems to be Solved by the Invention

However, when conventional switching device drive circuits are used, it is difficult to reduce the size and cost of a voltage converting device or the like including a switching device to be driven. Specifically, for example, if the frequency of the drive signal for driving the switching device is increased, the sizes of the reactor L and the capacitor C of the boost chopper circuit can be reduced. On the other hand, however, the switching loss of the switching device increases, so that the size of a cooler for cooling the switching device needs to be increased, for example. Thus, the size of the voltage converting device or the like cannot be necessarily reduced.

Also, when the gate resistance of the switching device is increased or the gate voltage thereof is decreased to allow the switching device to perform a gentle switching operation, the switching loss increases and the size of the voltage converting device or the like increases.

Moreover, in the technique of Patent Document 3, an inductance is required between the main emitter terminal and the auxiliary emitter terminal so as to detect the starting time of rising of the main collector current of the IGBT. The inductance is connected so as to detect the main collector current. Therefore, it is necessary to determine the capacitance of the inductance, depending on the electric specifications and the operating conditions of each IGBT, so as to avoid an influence on the main collector current and further accurately detect the starting time of rising of the main collector current, resulting in a poor degree of design flexibility. Moreover, since the change rate (di/dt) of the main collector current and the change rate (dv/dt) of the main collector voltage are simply reduced, the switching loss significantly increases. The means for changing the change rate (di/dt) of the main collector current and the change rate (dv/dt) of the main collector voltage only changes the value of a resistor connected to the gate power supply, so that an operation range that a change can be made is limited.

In addition, in the technique of Patent Document 4, when the voltage of the direct-current power supply is low, then if the operating speed of the switching device is increased, the switching loss can be reduced without occurrence of an excessive surge voltage. However, when the voltage of the direct-current power supply is high, the effect cannot be exhibited.

In view of the conventional disadvantages described above, the present invention has been achieved. An object of the present invention is to effectively suppress a switching loss when a switching device is driven irrespective of the voltage value of the direct-current power supply of an inverter (see Patent Document 4) and without adding a component, such as an inductance or the like (see Patent Document 3), thereby allowing the switching device to perform a high-frequency operation, so that the size and cost of a voltage converting device or the like are reduced.

In addition, another object of the present invention is to allow a switching device to perform a gentle switching operation as required, thereby effectively suppressing a surge voltage.

Solution to the Problems

To achieve the objects described above, according to the present invention, a predetermined voltage is not invariably fixedly supplied to a switching device during turning ON or OFF of the switching device. For example, a voltage higher than the predetermined voltage is supplied for a portion of the turning-ON period or the turning-OFF period, thereby quickly ending a switching operation to effectively reduce a switching loss.

Moreover, as described above, when the higher voltage is supplied to the switching device for the partial period, a surge voltage is likely to occur. However, by specifying the period for which the higher voltage is supplied, a switching operation is gently performed with respect to the switching device for periods other than the partial period, thereby effectively suppressing a surge voltage.

Specifically, the present invention provides a switching device drive circuit for receiving a pulse signal, and outputting a drive signal to a control terminal of a switching device including a power converting circuit for a predetermined period depending on the pulse signal. The switching device drive circuit has a control circuit for changing a voltage supplied or a current flowing, as a drive signal, to or through the control terminal of the switching device, to a voltage or a current different from a predetermined voltage or a predetermined current, and a control voltage detecting circuit for detecting a voltage of the control terminal of the switching device. The control circuit receives a voltage detection signal of the control voltage detecting circuit, and depending on a voltage value of the control terminal of the switching device, changes the voltage supplied or the current flowing, as the drive signal, to or through the control terminal of the switching device, to a voltage or a current different from the predetermined voltage or the predetermined current, only for a portion of the predetermined period corresponding to the pulse signal.

In the switching device drive circuit of the present invention, the control circuit changes the voltage supplied or the current flowing, as the drive signal, to or through the control terminal of the switching device, for an initial or final portion of the predetermined period, as the portion of the predetermined period corresponding to the pulse signal.

In the switching device drive circuit of the present invention, the control circuit has a boosting/dropping circuit for booting or dropping the predetermined voltage.

In the switching device drive circuit of the present invention, the control circuit changes the voltage supplied or the current flowing, as the drive signal, to or through the control terminal of the switching device, for the whole or a portion of a period until start of a mirror effect period during turning ON of the switching device, as the portion of the predetermined period corresponding to the pulse signal In the switching device drive circuit of the present invention, the control voltage detecting circuit detects, as the voltage of the control terminal of the switching device, a state of less than a predetermined voltage lower than or equal to a threshold voltage of the switching device, and outputs the voltage detection signal when detecting the state of less than the predetermined voltage. The control circuit, when receiving the voltage detection signal of the control voltage detecting circuit, changes the voltage supplied or the current flowing, as the drive signal, to or through the control terminal of the switching device, to a large value, and when no longer receiving the voltage detection signal, stops changing the voltage or the current to the large value.

In the switching device drive circuit of the present invention, the control circuit changes the voltage supplied or the current flowing, as the drive signal, to or through the control terminal of the switching device, to a large value, for a constant period including a portion of a mirror effect period during turning ON of the switching device, as the portion of the predetermined period corresponding to the pulse signal.

In the switching device drive circuit of the present invention, the control circuit changes the voltage supplied or the current flowing, as the drive signal, to or through the control terminal of the switching device, for a period from start of the predetermined period to end of a mirror effect period during turning ON of the switching device, as the portion of the predetermined period corresponding to the pulse signal.

In the switching device drive circuit of the present invention, the control circuit has an ON-control voltage circuit for changing a voltage of a drive signal supplied to the control terminal during turning ON of the switching device, to a voltage higher than a predetermined voltage for turning ON. The control voltage detecting circuit detects, as the voltage of the control terminal of the switching device, a voltage value higher than a threshold voltage of the switching device by a predetermined voltage, and outputs the voltage detection signal to the ON-control voltage circuit of the control circuit when the voltage value higher by the predetermined voltage is detected. The ON-control voltage circuit changes the voltage supplied as the drive signal to the control terminal of the switching device to the voltage higher than the predetermined voltage for turning ON during start of the predetermined period corresponding to the pulse signal, and when receiving the voltage detection signal of the control voltage detecting circuit, stops changing to the higher voltage.

In the switching device drive circuit of the present invention, the control circuit changes the voltage supplied or the current flowing, as the drive signal, to or through the control terminal of the switching device, for a period including a mirror effect period during turning OFF of the switching device, as the portion of the predetermined period corresponding to the pulse signal.

In the switching device drive circuit of the present invention, the control circuit has an OFF-control voltage circuit for changing a voltage supplied as a drive signal to the control terminal during turning OFF of the switching device, to a voltage lower than a predetermined voltage for turning OFF. The control voltage detecting circuit detects, as the voltage of the control terminal of the switching device, a voltage value lower than a threshold voltage of the switching device by a predetermined voltage, and outputs the voltage detection signal to an OFF-control voltage circuit of the control circuit when the voltage value lower by the predetermined voltage is detected. The OFF-control voltage circuit, when no longer receiving the pulse signal, changes the voltage supplied as the drive signal to the control terminal of the switching device to the voltage lower than the predetermined voltage for turning OFF, and when receiving the voltage detection signal of the control voltage detecting circuit, stops changing to the lower voltage.

In the switching device drive circuit of the present invention, the control circuit changes the voltage supplied or the current flowing, as the drive signal, to or through the control terminal of the switching device, for a period including a whole mirror effect period of the switching device, as the portion of the predetermined period corresponding to the pulse signal.

In the switching device drive circuit of the present invention, the control circuit has an ON-control voltage circuit for changing a voltage supplied as a drive signal to the control terminal, to a voltage lower than a predetermined voltage for turning ON, for a period including a whole mirror effect period of the switching device, during turning ON of the switching device.

In the switching device drive circuit of the present invention, the control circuit has an OFF-control voltage circuit for changing a voltage supplied as a drive signal to the control terminal, to a voltage higher than a predetermined voltage for turning OFF, for a period including a whole minor effect period of the switching device, during turning OFF of the switching device.

In the switching device drive circuit of the present invention, the control circuit changes the voltage supplied or the current flowing, as the drive signal, to or through the control terminal of the switching device, for a period from start of the predetermined period to an intermediate point of the mirror effect period during turning ON of the switching device, as the portion of the predetermined period corresponding to the pulse signal.

In the switching device drive circuit of the present invention, the control circuit has an ON-control voltage circuit for changing a voltage supplied as a drive signal to the control terminal during turning ON of the switching device, to a voltage higher than a predetermined voltage for turning ON. The control voltage detecting circuit detects, as the voltage of the control terminal of the switching device, a threshold voltage of the switching device, and after the detection of the threshold voltage, outputs the voltage detection signal to the ON-control voltage circuit of the control circuit after lapse of a predetermined set time. The ON-control voltage circuit changes the voltage supplied as the drive signal to the control terminal of the switching device to a voltage higher than the predetermined voltage for turning ON during start of the predetermined period corresponding to the pulse signal, and when receiving the voltage detection signal of the control voltage detecting circuit, stops changing to the higher voltage.

In the switching device drive circuit of the present invention, the control circuit changes the voltage supplied or the current flowing, as the drive signal, to or through the control terminal of the switching device, for a period from end of reception of the pulse signal to an intermediate point of the mirror effect period during turning OFF of the switching device, as the portion of the predetermined period corresponding to the pulse signal.

In the switching device drive circuit of the present invention, the control circuit has an OFF-control voltage circuit for changing a voltage supplied as a drive signal to the control terminal during turning OFF of the switching device, to a voltage lower than a predetermined voltage for turning OFF. The control voltage detecting circuit detects, as the voltage of the control terminal of the switching device, a predetermined voltage value less than a threshold voltage of the switching device, and after the detection of the predetermined voltage value, outputs the voltage detection signal to the OFF-control voltage circuit of the control circuit after lapse of a predetermined set time. The OFF-control voltage circuit changes the voltage supplied as the drive signal to the control terminal of the switching device to a voltage lower than the predetermined voltage for turning OFF at end of reception of the pulse signal, and when receiving the voltage detection signal of the control voltage detecting circuit, stops changing to the lower voltage.

In the switching device drive circuit of the present invention, the threshold voltage of the switching device in the control voltage detecting circuit is corrected, depending on temperature.

In the switching device drive circuit of the present invention, the threshold voltage of the switching device in the control voltage detecting circuit is corrected to be higher as a temperature of the switching device decreases, and is corrected to be lower as the temperature of the switching device increases.

The present invention also provides a switching device drive circuit for receiving a pulse signal, and outputting a drive signal to a control terminal of a switching device including a power converting circuit for a predetermined period corresponding to the pulse signal. The switching device drive circuit has a control circuit for changing a voltage or a current of a drive signal supplied to the control terminal of the switching device, to a voltage or a current different from a predetermined voltage or a predetermined current, a control resistor connected to the control terminal of the switching circuit, and a control voltage detecting circuit for detecting a voltage of both ends of the control resistor. The control circuit receives a voltage detection signal from the control voltage detecting circuit, and depending on the voltage of both the ends of the control resistor, changes the voltage or the current of the drive signal supplied to the control terminal of the switching device, to a voltage or a current different from the predetermined voltage or the predetermined current, only for a portion of a predetermined period corresponding to the pulse signal.

In the switching device drive circuit of the present invention, the control circuit largely changes the voltage or the current of the drive signal supplied to the control terminal of the switching device, for a period from start of the predetermined period to when a detected voltage difference of both the ends of the control resistor is zero, as the portion of the predetermined period corresponding to the pulse signal.

In the switching device drive circuit of the present invention, the switching device is formed of a wide band gap semiconductor including SiC or GaN.

As described above, according to the present invention, when the switching device is turned ON or OFF, a value of a voltage supplied to or a current flowing into the switching device is not fixed. The value of a voltage supplied to or a current flowing into the switching device is changed, depending on a control voltage of the switching device, for a portion of the period during turning ON or OFF. Therefore, by arbitrarily changing a switching operation, depending on an operation state of the switching device, without adding a component, such as an inductance or the like, and, for example, supplying a high voltage to the control terminal of the switching device as required, the switching operation can be made quicker, resulting in a reduction in switching loss.

In addition, when the switching device is turned ON or OFF, a normal voltage lower than the high voltage is supplied to the control terminal of the switching device for periods other than the period in which the high voltage is supplied to the control terminal of the switching device, so that a switching operation is made gentle and the occurrence of a surge voltage is suppressed.

Effect of the Invention

As described above, according to the switching device drive circuit of the present invention, when the switching device is turned ON or OFF, a voltage supplied to or a current flowing into the switching device is not fixed. The voltage supplied to or the current flowing into the switching device is changed for a portion of the period, thereby making it possible to make a switching operation quicker and effectively reduce a switching loss.

In addition, in a situation in which a surge voltage occurs, a voltage supplied to or a current flowing into the switching device is not changed to a large value, and is set to be a normal voltage value or a normal current value, thereby making it possible to suppress the occurrence of a surge voltage.

BRIEF DESCRIPTION OF THE DRAWINGS

FIG. 7(a) is a waveform diagram showing an exemplary drive voltage output from a drive signal output circuit of the switching device drive circuit of FIG. 1. FIG. 7(b) is a waveform diagram showing another exemplary drive voltage. FIG. 7(c) is a waveform diagram showing still another exemplary drive voltage.

Figure 1:
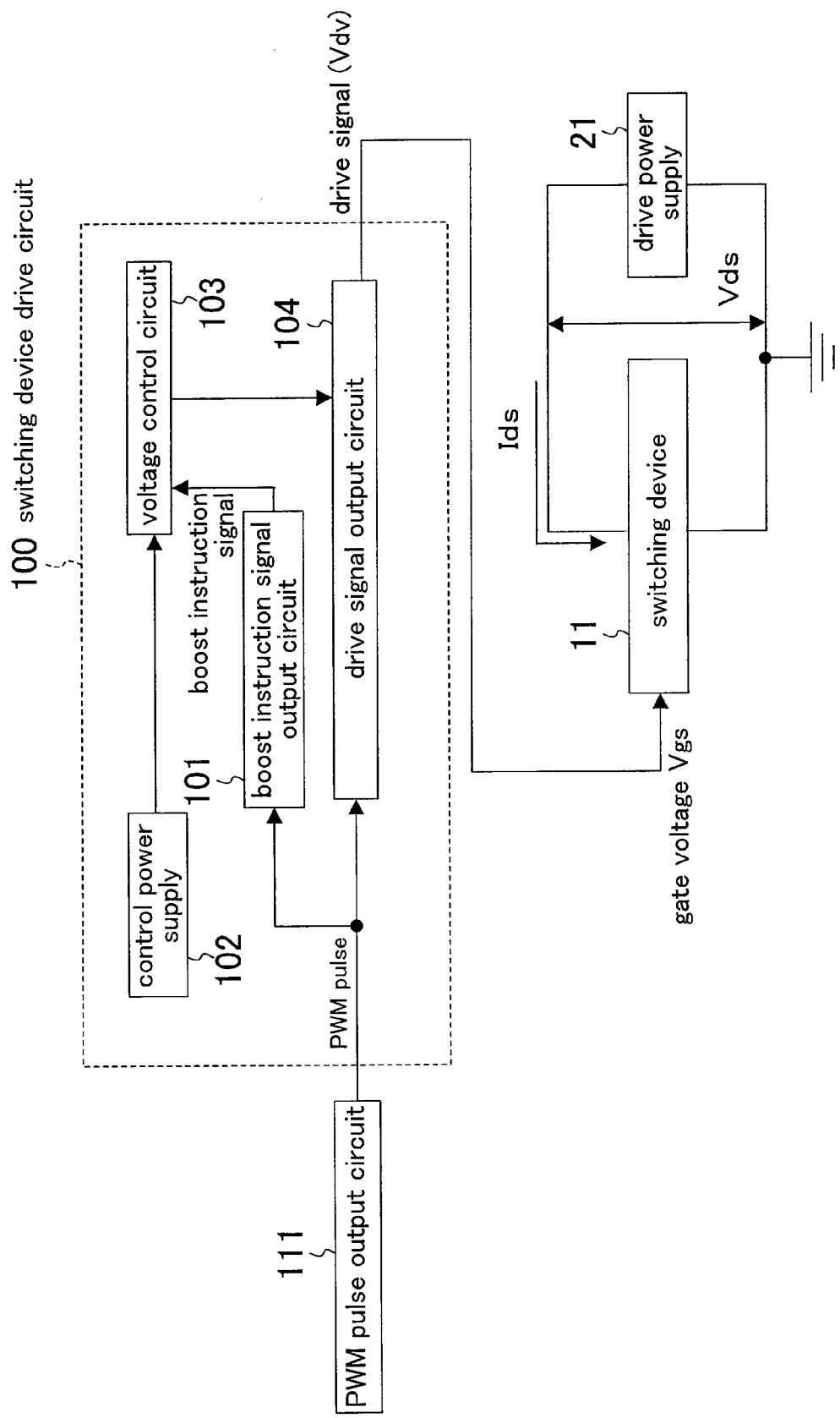
FIG. 1 is a block diagram schematically showing a configuration of a switching device drive circuit according to a first embodiment of the present invention.

DESCRIPTION OF THE REFERENCE CHARACTERS 2, 2a switching device drive circuit
3 PWM pulse output circuit
4 drive signal output circuit
5 ON-control voltage circuit
6 OFF-control voltage circuit
7, 7a first control voltage detecting circuit
8 second control voltage detecting circuit
51, 61 voltage converting circuit
52, 62 voltage variable circuit
71 voltage dividing circuit
72 first determination circuit
73 second determination circuit
74 third determination circuit
75 delay circuit
603 first reference voltage
604 second reference voltage
605 third reference voltage
606 control resistor
500 three-terminal regulator
501, 50, 503 transistor
11 switching device
21 power supply
100 switching device drive circuit
101 boost instruction signal output circuit
102 control power supply
103 voltage control circuit (control circuit)
104 drive signal output circuit
104a switching device
104b switching device
111 PWM pulse output circuit
200 switching device drive circuit
201 gate voltage detecting circuit (control voltage detecting circuit)
800 switching device drive circuit
801 boost instruction signal output circuit
802 control power supply
803 voltage control circuit

BEST MODE FOR CARRYING OUT THE INVENTION

Hereinafter, embodiments of the present invention will be described with reference to the accompanying drawings.

First Embodiment

FIG. 1 schematically shows a whole configuration of a switching device drive circuit according to a first embodiment of the present invention.

In FIG. 1, the switching device drive circuit 100 comprises a boost instruction signal output circuit 101, a control power supply 102, a voltage control circuit 103, and a signal output circuit 104. The switching device drive circuit 100 outputs a drive signal (a drive pulse, a gate drive voltage) to a control terminal (gate) of a switching device 11 to be driven.

The switching device 11 to be driven is provided in a power converting circuit, such as a chopper circuit, an inverter or the like, but the present invention is not limited to this (note that FIG. 1 schematically shows a circuit for controlling a power, a voltage and a current supplied from a power supply 21, but loads to which the power and the like are supplied are not shown, for the sake of simplicity).

Figure 3:
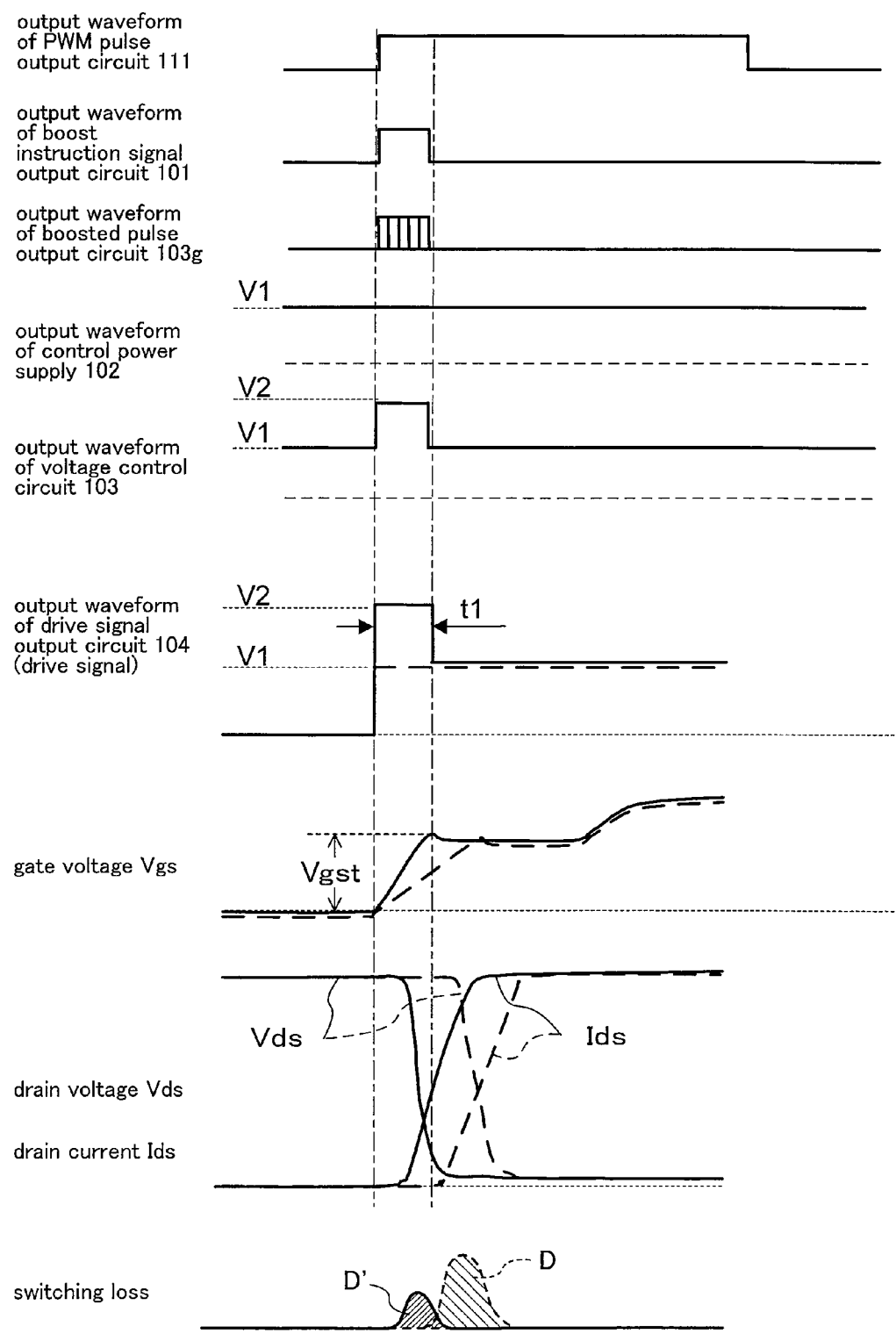
FIG. 3 is a timing chart showing signals of main components of the switching device drive circuit of FIG. 1.

As shown in FIG. 3, the boost instruction signal output circuit 101 outputs a boost instruction signal that goes to the H level in synchronization with timing of the transition from the L (Low) level to the H (High) level of a PWM pulse output from a PWM pulse output circuit 111 and is then held at the H level for a predetermined period t1.

The control power supply 102 outputs a predetermined voltage V1 described below. Note that the voltage V1 may be supplied from the outside of the switching device drive circuit 100.

The voltage control circuit (control circuit) 103 outputs the predetermined voltage V1 as it is, from the control power supply 102 when the boost instruction signal is at the L level, and a boosted voltage V2 obtained by boosting the voltage V1 when the boost instruction signal is at the H level.

Here, the period t1, the voltage V1 and the boosted voltage V2 are set as follows, for example. Specifically, the boosted voltage V2 is desirably a voltage that is set based on, for example, a maximum voltage that can be supplied to the gate of the switching device 11 to be driven, or the life of the switching device 11 depending on a voltage supplied to the gate. Also, the predetermined voltage V1 is desirably a voltage that is set based on, for example, the tolerable maximum voltage or the life of the switching device 11 when it is stationarily supplied thereto, as with the boosted voltage V2. The period t1 is set to be a time sufficient to cause the switching device 11 to be turned ON within a time for which a set tolerable switching loss is satisfied, depending on the switching device 11 to be driven, for example. In a narrow sense, the boosted voltage V2 only needs to be set so that the rising of the gate voltage caused by charging of electric charges to the gate is rapidly performed (e.g., the voltage output from the voltage control circuit 103 in the absence of a load or in the presence of a predetermined load is higher than in a stationary state), even if the boosted voltage V2 is not necessarily higher than the predetermined voltage V1 in the stationary state when a wiring resistance or the like is taken into consideration.

Figure 2:
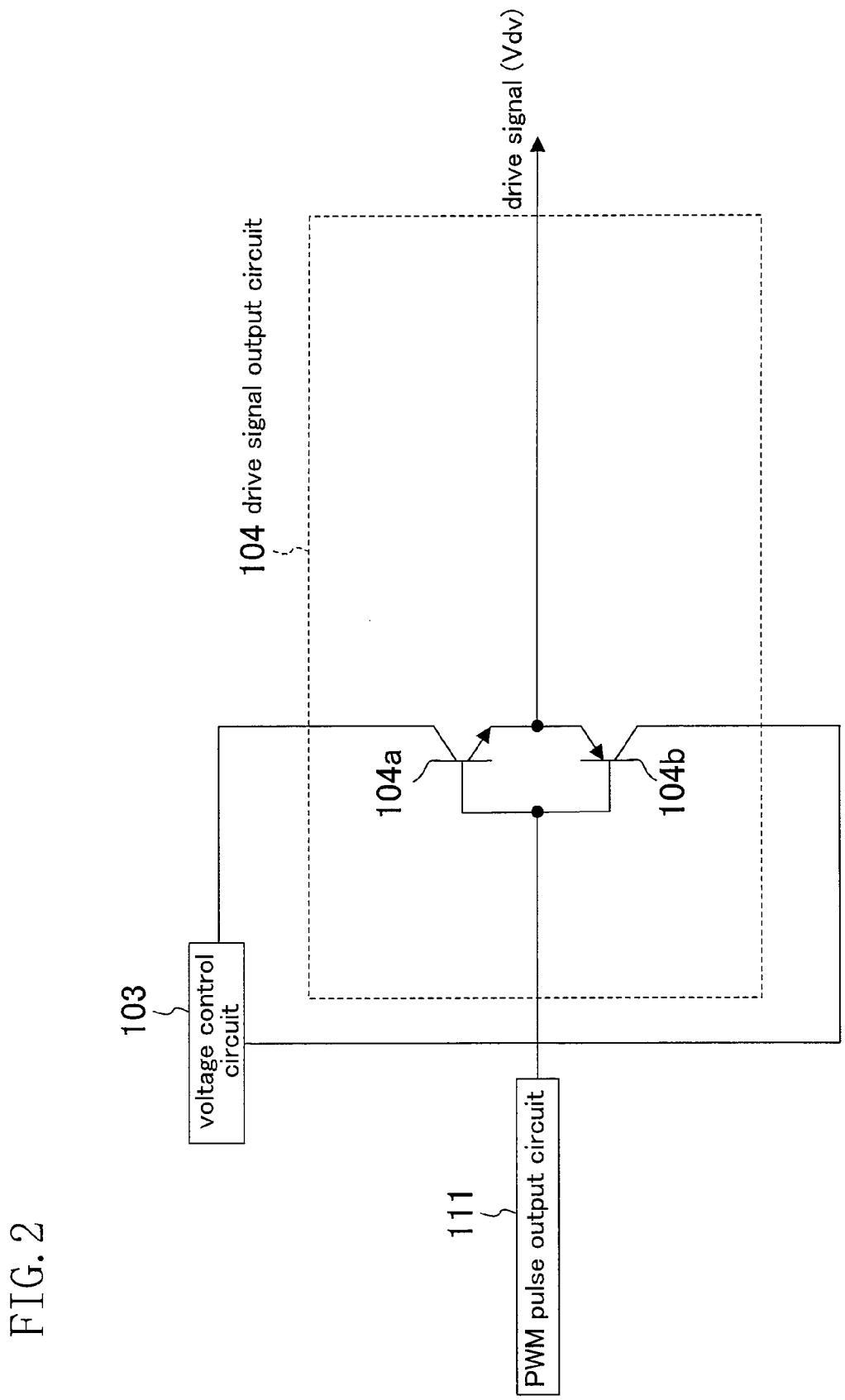
FIG. 2 is a diagram showing an internal configuration of a drive signal output circuit included in the switching device drive circuit of FIG. 1.

The drive signal output circuit 104 comprises upper and lower switching devices 104a and 104b that are connected in an arm-like shape as shown in FIG. 2. The drive signal output circuit 104 functions as a buffer circuit to amplify the voltage of a PWM pulse output from the PWM pulse output circuit 111 to a voltage output from the voltage control circuit 103 (power is also amplified). Specifically, when the PWM pulse is at the H level, the predetermined voltage V1 or the boosted voltage V2 output from the voltage control circuit 103 is output as the drive signal (voltage Vdv).

An operation of the thus-configured switching device drive circuit 100 will be described with reference to FIG. 3. When the PWM pulse output from the PWM pulse output circuit 111 goes to the H level, the boost instruction signal output circuit 101 outputs a H-level boost instruction signal for the period t1. The voltage control circuit 103 outputs a boosting pulse having a predetermined frequency for the period t1. By the switching device 103b being turned ON/OFF in response to this, the predetermined voltage V1 supplied from the control power supply 102 is boosted to the boosted voltage V2, which is then output.

In the drive signal output circuit 104, the switching device 104a is turned ON when the PWM pulse output from the PWM pulse output circuit 111 goes to the H level, and the voltage Vdv of the output drive signal is held at the voltage V2 boosted by the voltage control circuit 103 for the period t1, and after the lapse of the period t1, returns to the predetermined voltage V1. Therefore, an electrostatic capacitance between the gate of the switching device 11 and a negative power supply or the like is quickly charged, so that the gate voltage Vgs quickly increases, and therefore, a switching operation is started. In other words, a switching operation can be quickly performed as compared to when the voltage of the drive signal is not boosted for the period t1 as indicated by a dashed line in FIG. 3.

Note that, specifically, for the following period tm, the gate voltage Vgs is substantially constant due to a change in parasitic capacitance of the switching device 11 (generally called a mirror effect), and after completion of the mirror effect, increases to the voltage V1 supplied to the drive signal output circuit 104.

By the switching operation in response to the quick change in the gate voltage Vgs, a source-drain voltage Vds of the switching device 11 rapidly decreases, and a current Ids rapidly increases. Therefore, as shown in FIG. 3, a switching loss (an area surrounded by Vds×Ids) is suppressed to a switching loss D' smaller than a switching loss D when boosting is not performed.

As described above, in this embodiment, as can be seen from FIG. 3, when the switching device 11 is turned ON, the boosted voltage V2 that is higher than the predetermined voltage V1 that is stationarily supplied to the gate is supplied only for the initial period t1 from the time of transition of the PWM pulse output from the PWM pulse output circuit 111 to the H level until the gate voltage of the switching device 11 increases to a predetermined voltage Vgst, thereby making it possible to increase the speed of the switching operation without invariably supplying an excessive voltage to the gate of the switching device 11. Thereby, the delay time and the switching loss can be reduced without applying extra stress to the gate of the switching device 11.

(Specific Example of Boost Instruction Signal Output Circuit)

Figure 4:
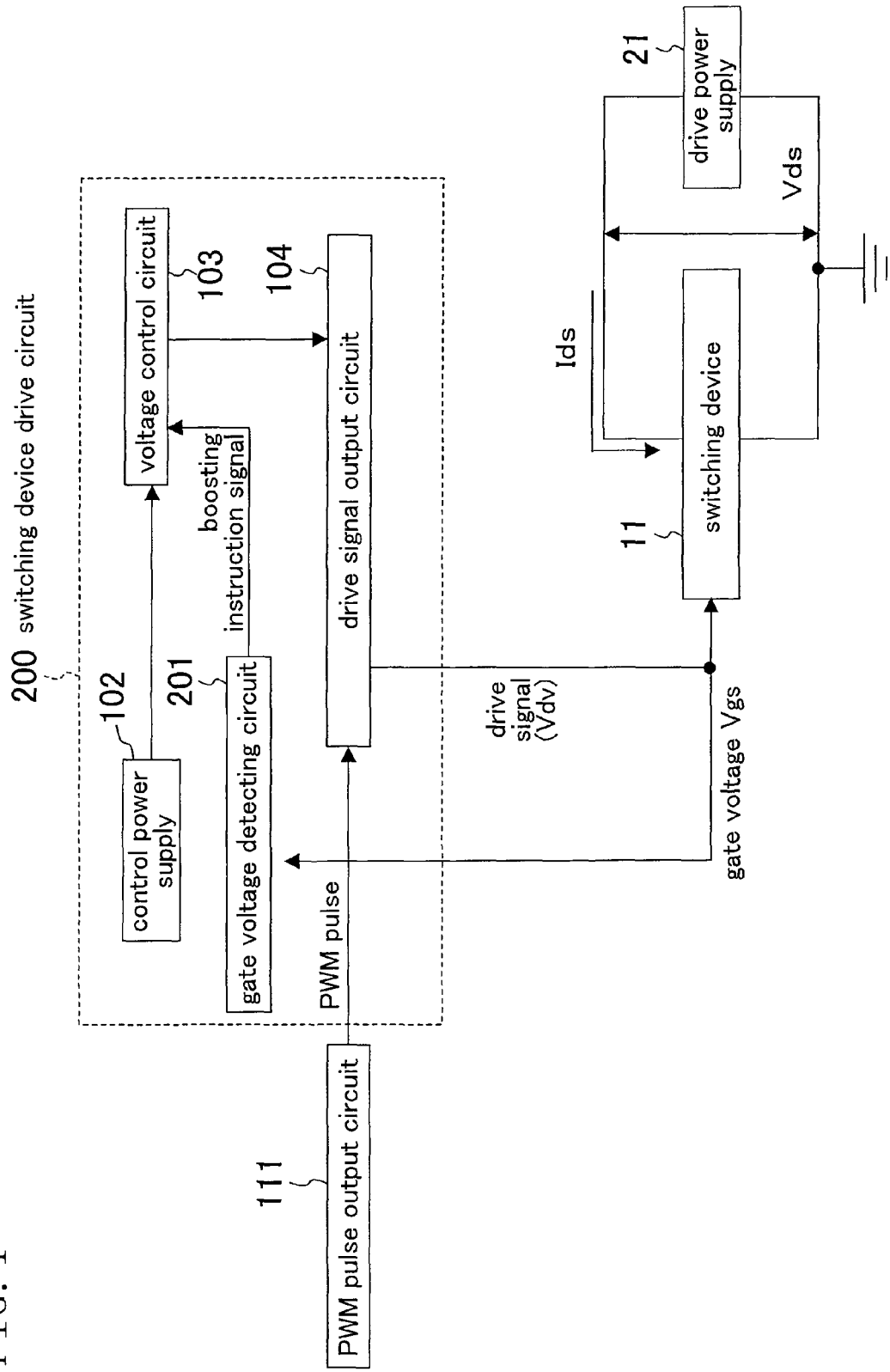
FIG. 4 is a diagram showing a configuration of a gate voltage detecting circuit as a boost instruction signal output circuit included in the switching device drive circuit of FIG. 1.

The boost instruction signal output circuit 101 is specifically embodied as a gate voltage detecting circuit 201 as shown in FIG. 4.

Figure 5:
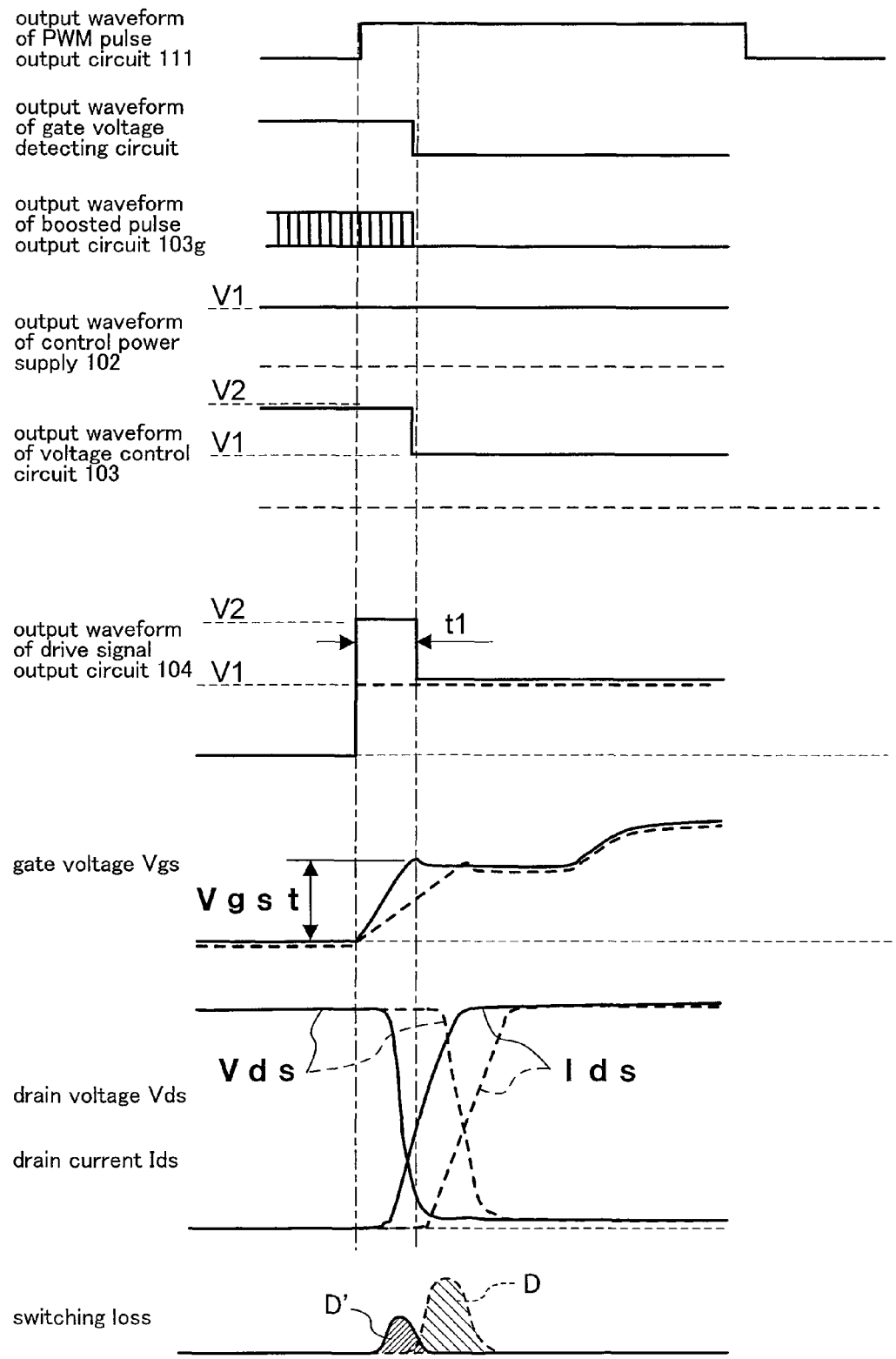
FIG. 5 is a timing chart showing signals of main components of a switching device drive circuit including the gate voltage detecting circuit of FIG. 4.

The gate voltage detecting circuit (control voltage detecting circuit) 201 detects the gate voltage (control voltage) of the switching device 11. When the detected gate voltage (voltage detection signal) is lower than the predetermined voltage Vgst as shown in FIG. 5, the gate voltage detecting circuit 201 outputs an H-level boost instruction signal. When the detected gate voltage exceeds the predetermined voltage Vgst, the gate voltage detecting circuit 201 changes the output boost instruction signal back to the L level. The predetermined voltage Vgst has, for example, a voltage value lower than or equal to the threshold voltage of the switching device 11, and is desirably the threshold voltage of the switching device 11.

An operation of the thus-configured switching device drive circuit 200 will be described with reference to FIG. 5.

When the PWM pulse output from the PWM pulse output circuit 111 is at the L level, the drive signal output circuit 104 outputs the predetermined voltage V1 of the voltage control circuit 103, and the gate voltage Vgs also goes to the predetermined voltage V1 of the switching device 11. Since the gate voltage Vgs is lower than the threshold voltage Vgst, the boost instruction signal output from the gate voltage detecting circuit 201 is at the H level. Therefore, the voltage control circuit 103 outputs a boosting pulse having a predetermined frequency, and boosts the predetermined voltage V1 from the control power supply 102 to the boosted voltage V2. Note that, as described above, when the PWM pulse is at the L level, the boosted voltage V2 is not output from the drive signal output circuit 104.

In this state, when the PWM pulse goes to the H level, the drive voltage Vdv output from the drive signal output circuit 104 goes to the boosted voltage V2, so that the gate voltage Vgs of the switching device 11 quickly increases.

Thereafter, when the gate voltage Vgs exceeds the threshold voltage Vgst, the boost instruction signal output from the gate voltage detecting circuit 201 goes to the L level. Therefore, the voltage control circuit 103 stops boosting and outputs the predetermined voltage V1, and the drive voltage Vdv output from the drive signal output circuit 104 goes to the predetermined voltage V1.

Specifically, the boosted voltage V2 is supplied to the gate of the switching device 11 for a time necessary and sufficient to cause the switching device 11 to be quickly turned ON. Also, since the drive voltage Vdv output from the drive signal output circuit 104 is controlled, depending on the gate voltage Vgs, an extraordinary phenomenon, such as an oscillation operation due to continuous supply of the boosted voltage V2 or the like, is suppressed. Thereby, an invariably stable and high-speed switching operation can be easily performed.

Variation of First Embodiment

Next, a variation of the first embodiment will be described.

In the switching device drive circuit for driving the switching device, it is preferable to use a single power supply in terms of simplification of the drive circuit and a reduction in cost. However, when a threshold voltage above which the switching device performs an ON operation or when a normally-ON switching device (the threshold voltage is a negative voltage) is driven, a negative power supply may be required so as to allow the semiconductor device to reliably perform an OFF operation. An example of such a switching device drive circuit will be described.

Figure 6:
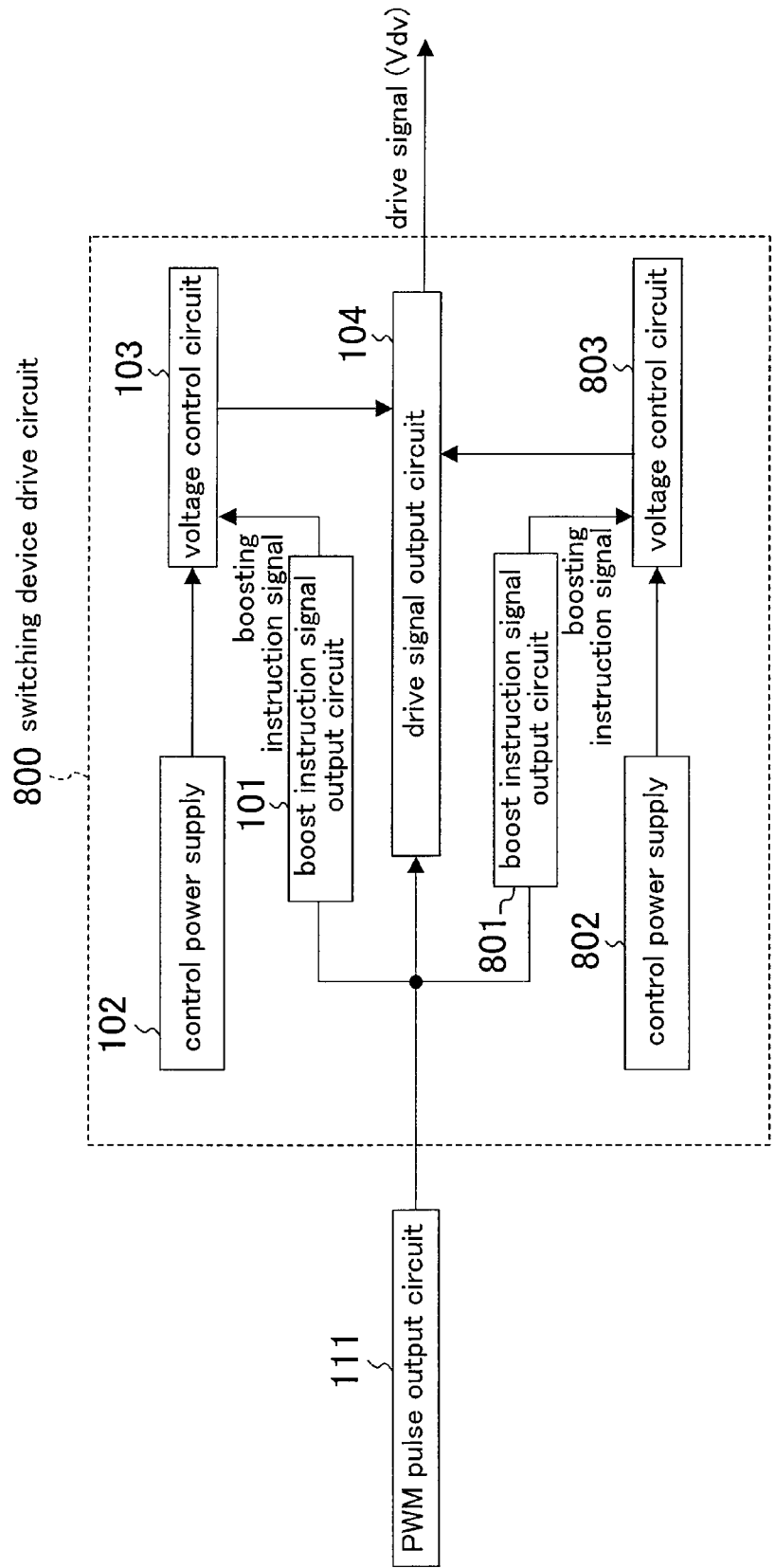
FIG. 6 is a diagram showing a variation of the switching device drive circuit of FIG. 1.

A variation of the switching device drive circuit will be described with reference to FIG. 6. As shown in FIG. 6, a switching device drive circuit 800 comprises a boost instruction signal output circuit 801, a control power supply 102 and a voltage control circuit 103 in addition to the components of the switching device drive circuit 100 of FIG. 1. The boost instruction signal output circuit 801, the control power supply 102 and the voltage control circuit 103 of FIG. 6 have configurations similar to those of the boost instruction signal output circuit 101, the control power supply 102 and the voltage control circuit 103 of FIG. 1. Note that the boost instruction signal output circuit 801, the control power supply 102 and the voltage control circuit 103 of FIG. 6 are operated with a voltage having a reverse polarity. Thereby, a switching device that requires both positive and negative power supplies can be driven by the switching device drive circuit 800. Also, control circuits can be provided separately for a turning-ON operation and a turning-OFF operation of the switching device. Therefore, only one of the turning-ON operation and the turning-OFF operation can be operated with high speed or low speed. Therefore, a switching operation suitable for a power converter, or moreover, a system employing the power converter can be achieved.

In the example above, a drive voltage is changed within intermittent predetermined periods corresponding to a pulse signal so as to increase a drive voltage when the switching device 11 is turned ON. The present invention is not limited to this. For example, as shown in FIG. 7(a), the transition of the switching device 11 to the OFF state may be made quicker by reducing the drive voltage, thereby reducing a switching loss when the switching device 11 is turned OFF. Moreover, by combining these, the drive voltage may be increased when the switching device 11 is turned ON, and the drive voltage may be reduced when the switching device 11 is turned OFF.

Also, conversely, for example, as shown in FIGS. 7(b) and 7(c), the drive voltage may be set to be an intermediate voltage during one or both of the ON and OFF states of the switching device 11, the surge voltage and the surge current may be actively reduced or the like.

(Variation of Drive Signal Output Circuit)

In the switching device drive circuit of FIGS. 1 and 4, the voltage that is output from the drive signal output circuit 104 and is supplied as a drive signal, is changed to the predetermined voltage V1 and the boosted voltage V2 by the voltage control circuit 103. In this variation, the drive signal output circuit employs a voltage having a fixed value that is supplied to the drive signal instead of changing the voltage of the drive signal output to the switching device 11, and changes the magnitude of a current caused to flow as a drive signal output to the switching device 11.

Figure 8:
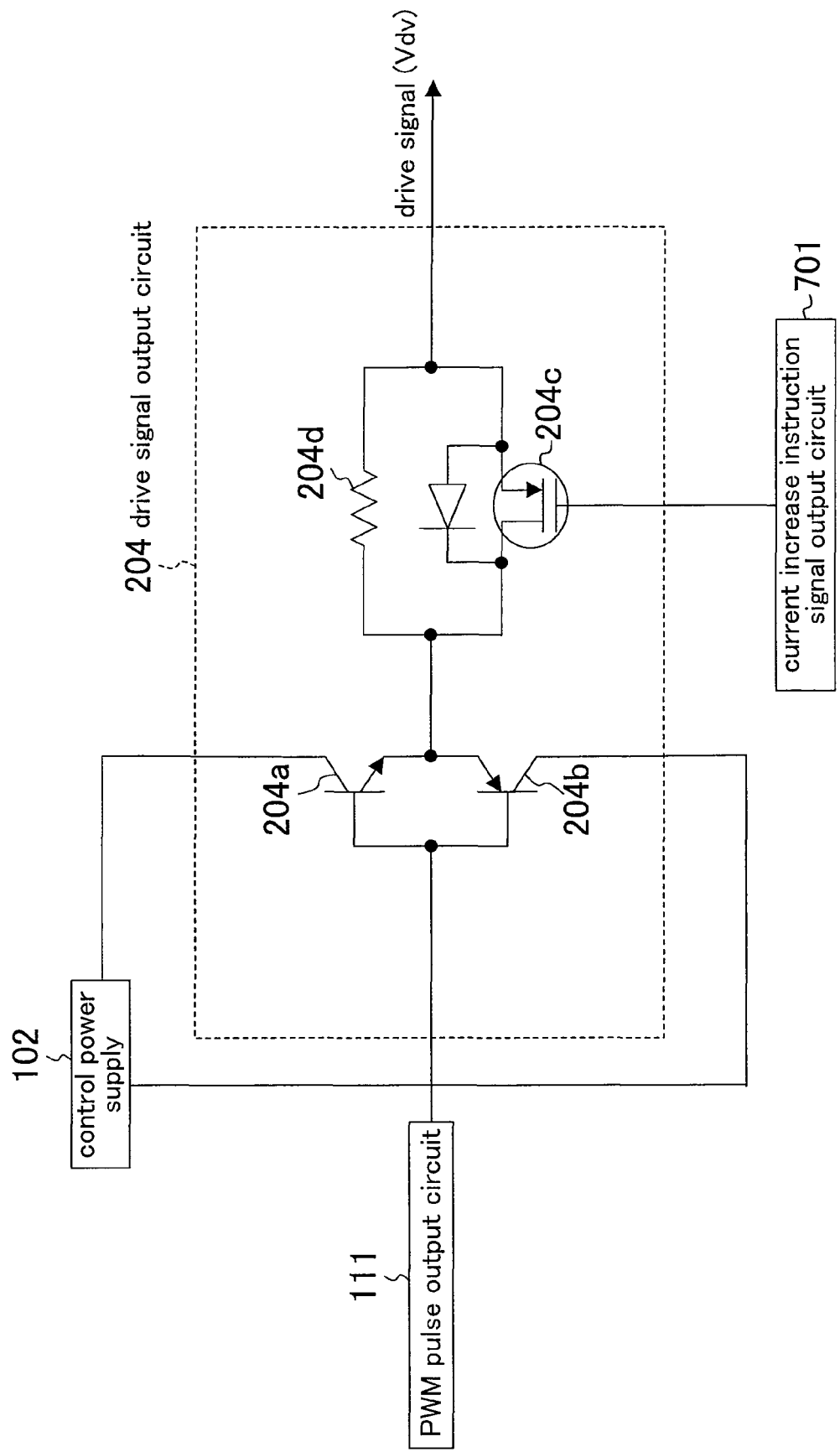
FIG. 8 is a diagram showing another variation of the switching device drive circuit of FIG. 1.

In a switching device drive circuit shown in FIG. 8, a drive signal output circuit 204 comprises upper and lower switching devices 204a and 204b each connected in an arm-like shape, a resistor 204d, and a switching device 204c connected in parallel to the resistor 204d.

The switching device drive circuit of FIG. 8 further comprises a current increase instruction signal output circuit 701 and a control power supply 102. The current increase instruction signal output circuit 701, when turning ON the switching device 11, causes a current increase instruction signal to intermittently go to the H level, thereby causing the switching device 204c to intermittently go to the ON state, for the period t1 described in Embodiment 1, for example. The switching device 204c of the drive signal output circuit 204 is turned ON when the current increase instruction signal goes to the H level. Note that after the switching device 11 goes to the ON state, a switching device 704c is turned OFF, for example.

With the configuration above, when the PWM pulse goes from the L level to the H level, a current flowing from the control power supply 102 via the switching device 204a flows to the gate of the switching device 11 via the resistor 204d when the switching device 204c is OFF. On the other hand, when the switching device 204c is ON, the current flows via the switching device 204c. Therefore, as compared to when the current not flows via the resistor 204d, the stability is maintained high. As compared to when the current flows only via the resistor 204d, the gate of the switching device 11 is quickly charged, so that switching is performed with high speed, and therefore, a switching loss can be suppressed to a small level.

Here, when the switching device 11 is turned OFF, then even if the switching device 204c is OFF, an OFF time can be reduced by a parasitic diode of a switching device 24c. Moreover, the OFF time can be further reduced by connecting the parasitic diode and a Schottky diode capable of high-speed operation in parallel thereto.

Second Embodiment

Figure 9:
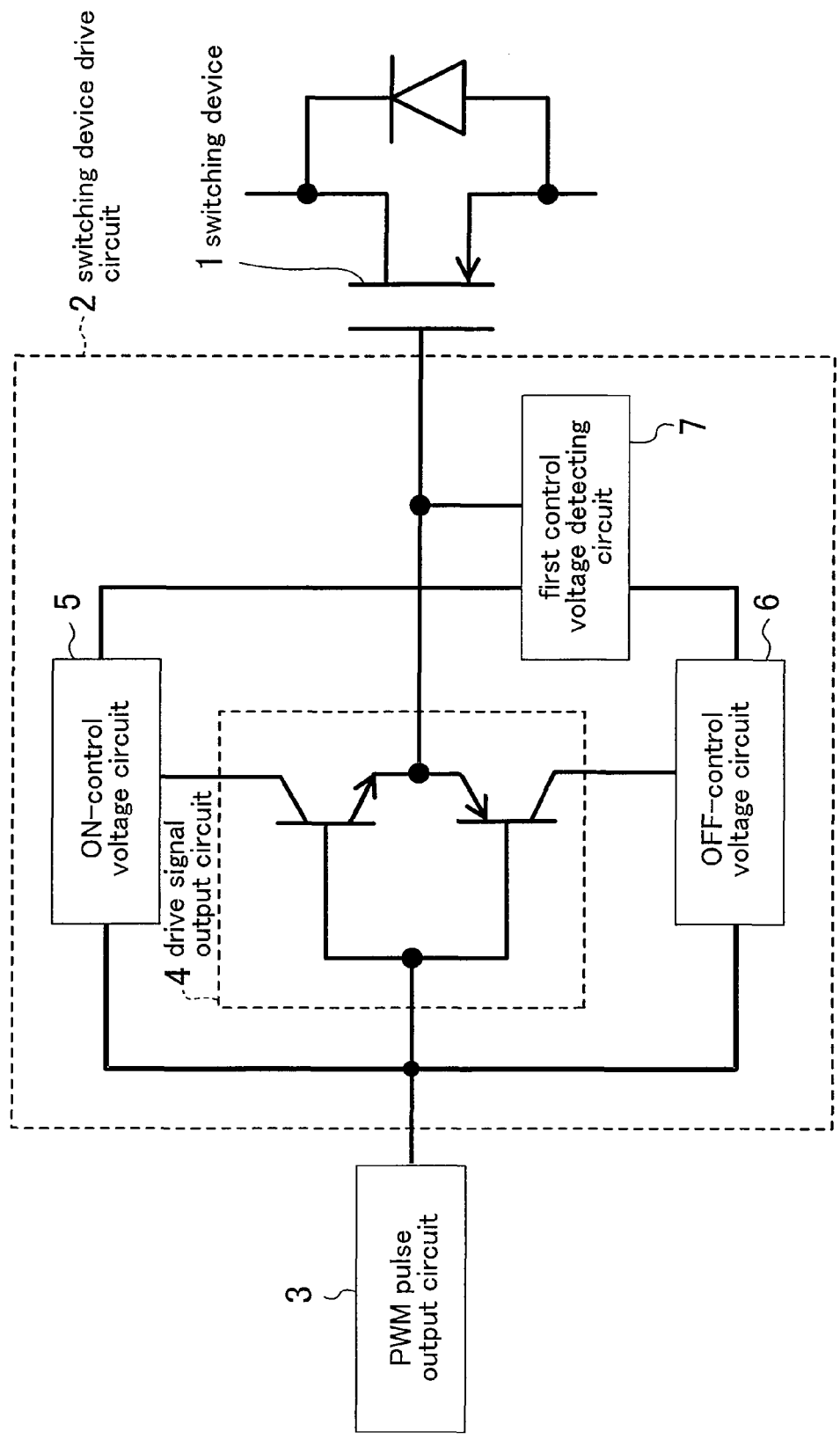
FIG. 9 is a block diagram schematically showing a configuration of a switching device drive circuit according to a second embodiment of the present invention.

FIG. 9 is a diagram showing a configuration of a switching device drive circuit according to a second embodiment of the present invention.

In FIG. 9, the switching device drive circuit 2 outputs a drive signal for performing a switching operation of the voltage drive switching device 1 in accordance with a PWM signal of a PWM pulse output circuit 3. Here, the drive signal and the PWM signal are synchronous. The switching device drive circuit 2 comprises a drive signal output circuit 4, an ON-control voltage circuit 5, an OFF-control voltage circuit 6, and a first control voltage detecting circuit 7.

An output of the PWM pulse output circuit 3 is connected to an input of the switching device drive circuit 2, while an output of the switching device drive circuit 2 is connected to a control terminal (gate terminal) of the voltage drive switching device 1. The switching device drive circuit 2 comprises the drive signal output circuit 4, the ON-control voltage circuit 5, and an OFF-control circuit 6. At least one of the ON-control voltage circuit 5 and the OFF-control voltage circuit 6 can change an output voltage in accordance with a voltage detection signal that is obtained and output by a control voltage detecting circuit 7.

The drive signal output circuit 4 is synchronous with the PWM signal output from the PWM pulse output circuit 3, and outputs a power-amplified signal to the control terminal of the voltage drive switching device 1.

Next, the ON-control voltage circuit 5, the OFF-control voltage circuit 6 and the control voltage detecting circuit 7 will be described using a specific exemplary circuit.

Figure 10:
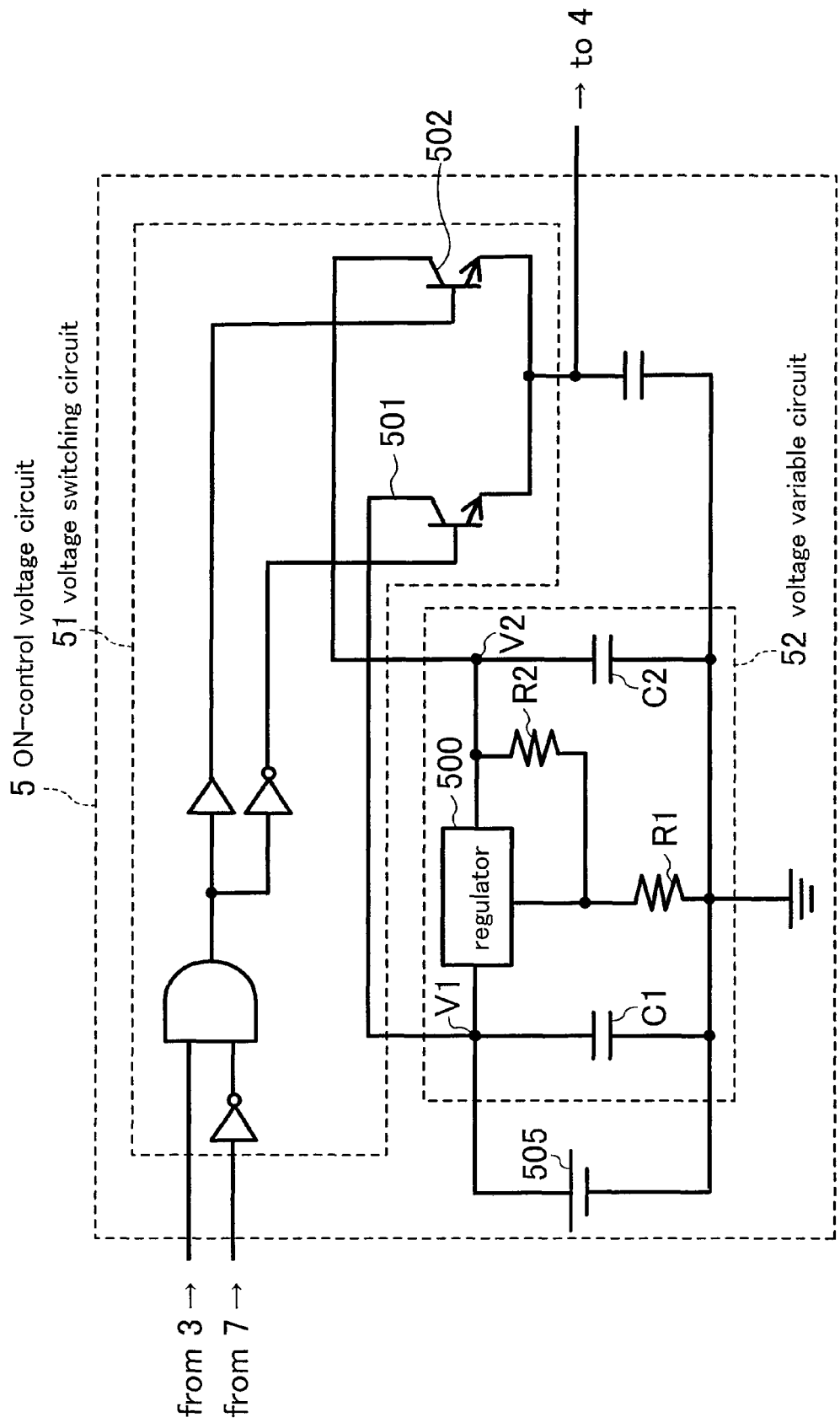
FIG. 10 is a diagram showing an internal configuration of an ON-control voltage circuit included in the switching device drive circuit of FIG. 9.
Figure 11:
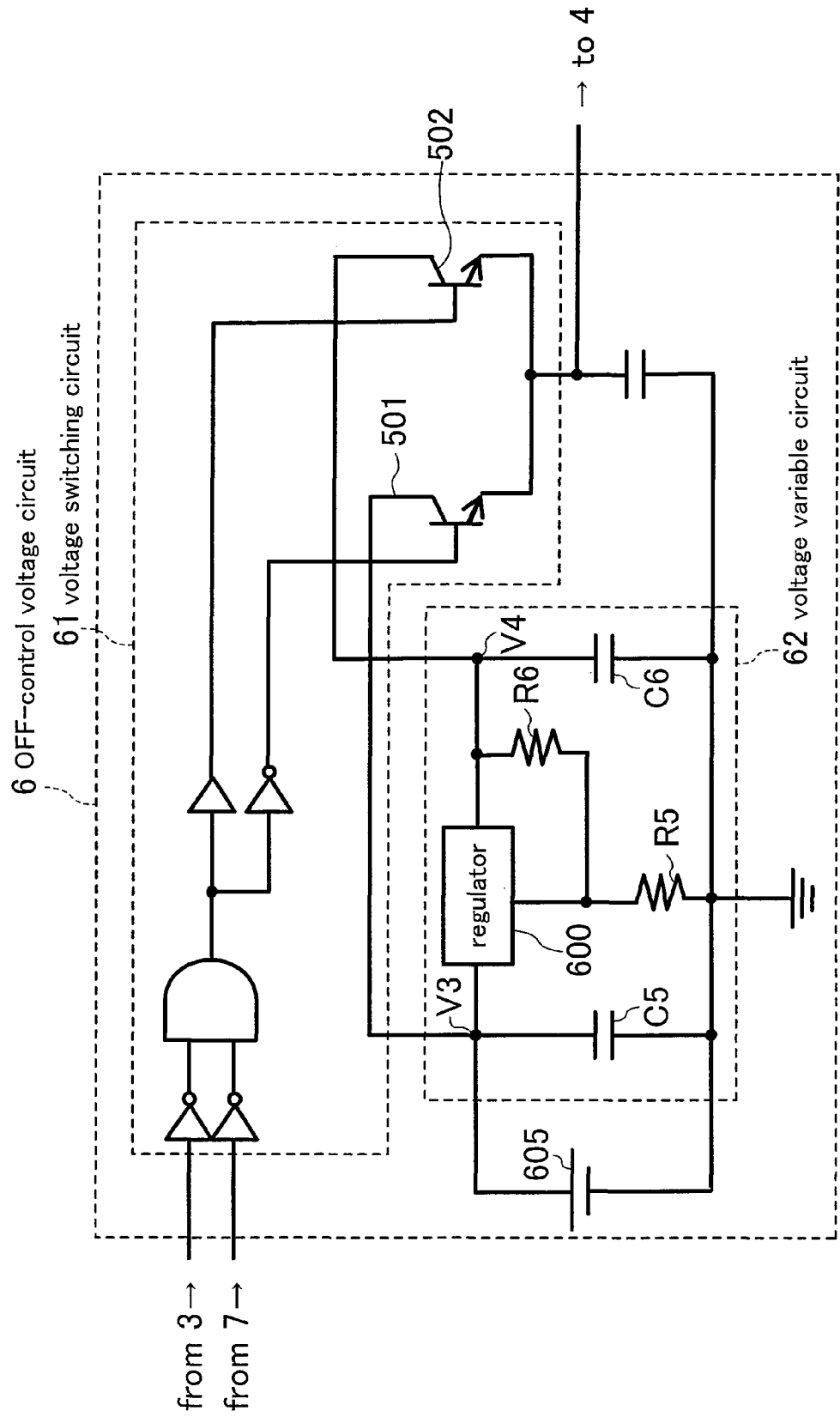
FIG. 11 is a diagram showing an internal configuration of an OFF-control voltage circuit included in the switching device drive circuit of FIG. 9.

FIGS. 10 and 11 are diagrams showing examples of the ON-control voltage circuit 5 and the OFF-control voltage circuit 6.

In FIG. 10, the ON-control voltage circuit 5 comprises a voltage converting circuit 51 and a voltage variable circuit 52. The voltage variable circuit 52 comprises a three-terminal regulator 500, two resistors R1 and R2, and two capacitors C1 and C2. In the voltage variable circuit 52, a voltage of a reference voltage source 505 as a predetermined voltage V1 for turning ON is supplied to the capacitor C1, and the predetermined voltage V1 for turning ON is changed (boosted) by a factor of about 1.5 to 2.0 by the three three-terminal regulator (boosting circuit) 500, so that the resultant boosted voltage V2 is generated at the capacitor C2. The voltage converting circuit 51 comprises a logic circuit, and transistors 501 and 502 for switching an input voltage and an output voltage of the voltage variable circuit 52.

The voltage converting circuit 51 receives the PWM signal and the voltage detection signal. Only when the PWM signal is at the High level and the voltage detection signal is at the Low level, the transistor 502 is turned ON and the transistor 501 is turned OFF. When otherwise, the transistor 502 is turned OFF and the transistor 503 is turned ON.

Figure 14:
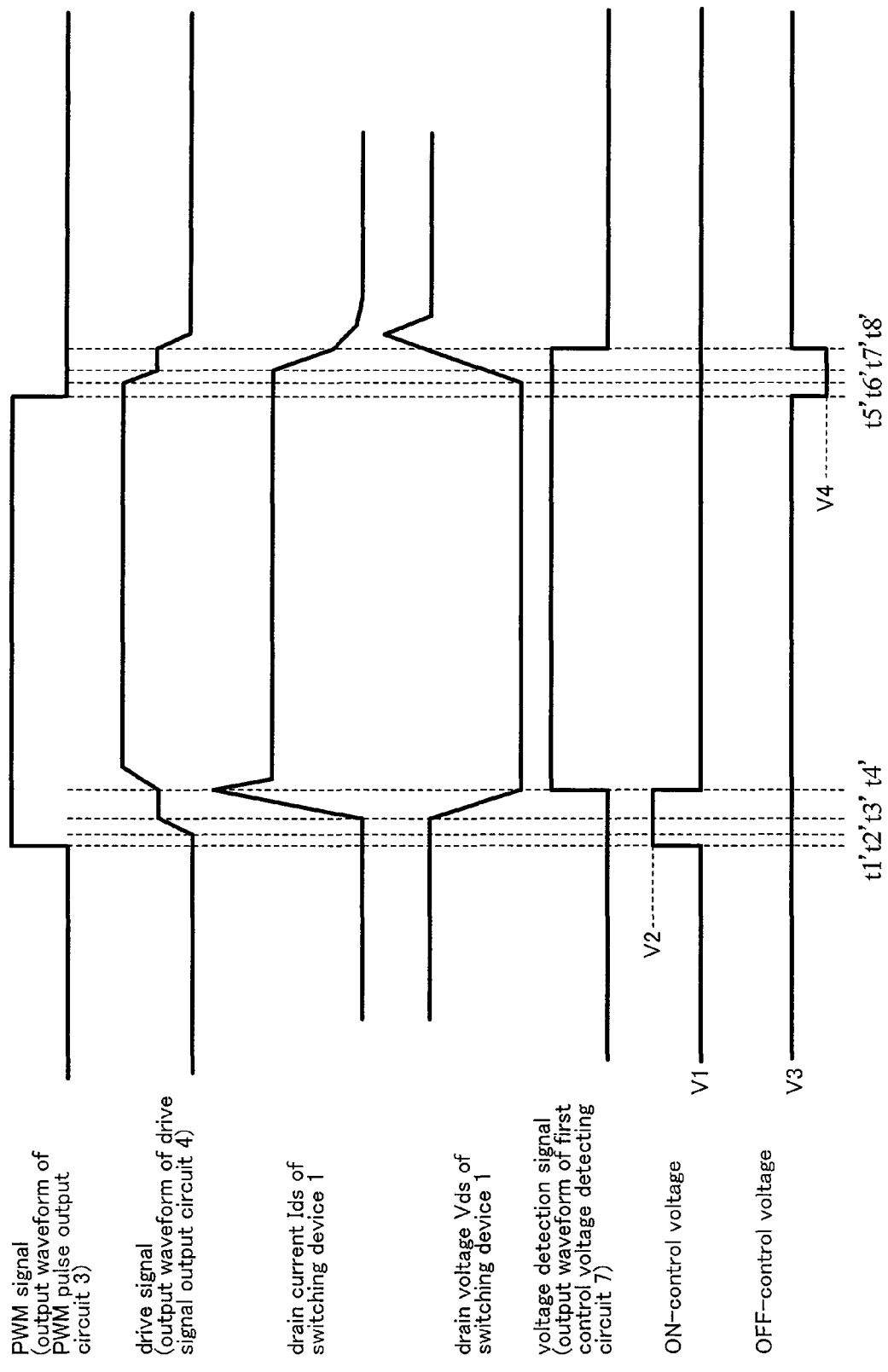
FIG. 14 is a timing chart showing signals of main components of the switching device drive circuit of FIG. 9.

As can be seen from an operation waveform of FIG. 14, the PWM signal is at the High level and the voltage detection signal is at the Low level for a period from time t1' to time t4'.

In FIG. 11, the OFF-control voltage circuit 6 comprises a voltage converting circuit 61 and a voltage variable circuit 62. The OFF-control voltage circuit 6 is different from the ON-control voltage circuit 5 in that the voltage converting circuit 51 and the voltage variable circuit 52 are replaced with the voltage converting circuit 61 and the voltage variable circuit 62. Only when the PWM signal is at the Low level and the voltage detection signal is at the High level, the voltage converting circuit 61 turns ON the transistor 502 and OFF the transistor 501, and when otherwise, the voltage converting circuit 61 turns OFF the transistor 502 and ON the transistor 501. The voltage variable circuit 62 comprises a three-terminal regulator 600, two resistors R5 and R6, and two capacitors C5 and C6. In the voltage variable circuit 62, a voltage of a voltage source 605 as a predetermined voltage V3 for turning OFF is supplied to the capacitor C5, and the predetermined voltage V3 for turning OFF is changed (dropped) by a factor of about 1.5 to 2.0 by the three-terminal regulator (voltage dropping circuit) 600, so that the resultant dropped voltage V4 is generated at the capacitor C6. As can be seen from the operation waveform of FIG. 14, the PWM signal is at the Low level and the voltage detection signal is at the High level for a period from time t5' to t8'. The basic operation is the same and will not be described.

Figure 12:
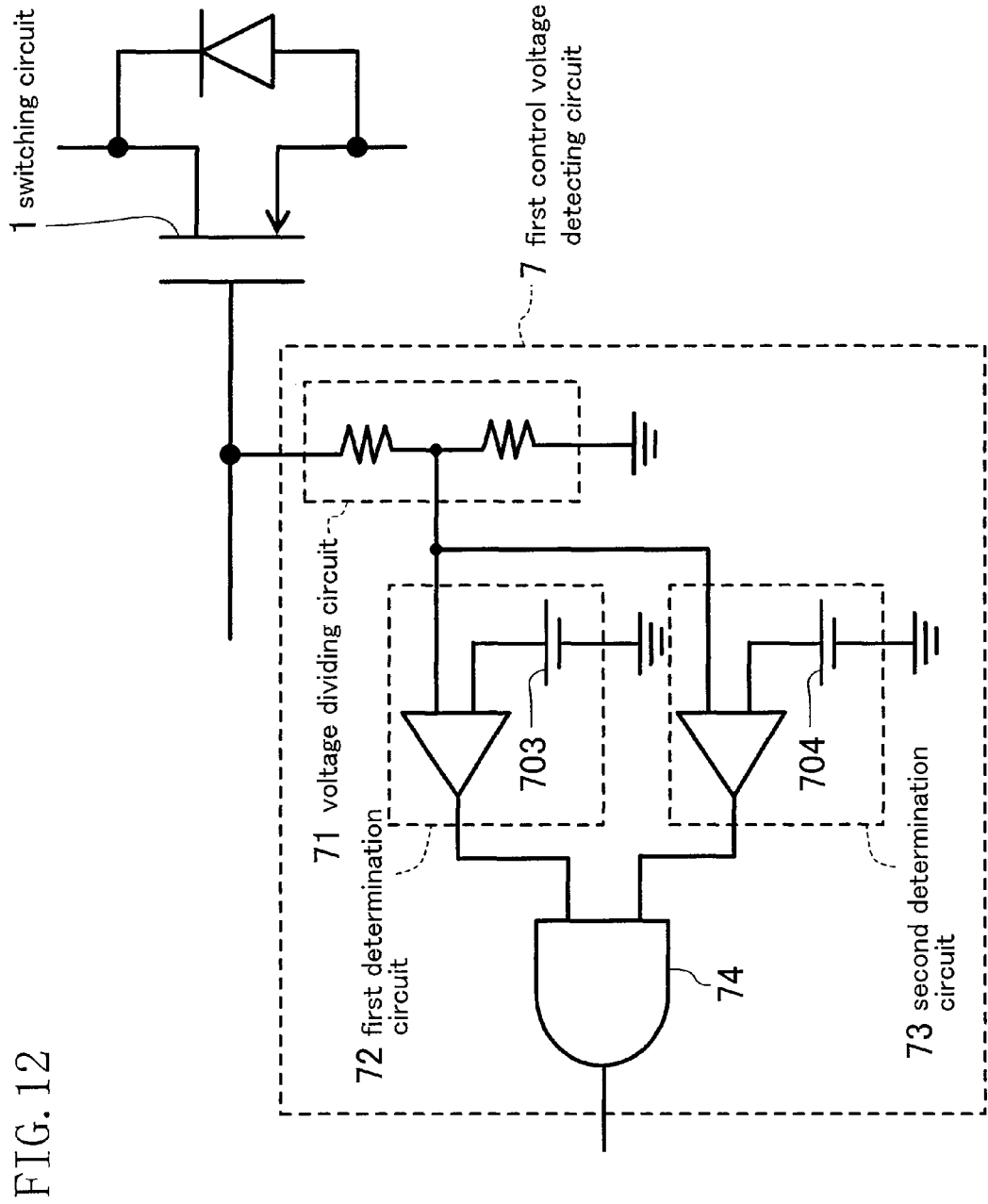
FIG. 12 is a diagram showing an internal configuration of a first control voltage detecting circuit included in the switching device drive circuit of FIG. 9.

FIG. 12 is a diagram showing an exemplary configuration of the first control voltage detecting circuit 7. In FIG. 12, the first control voltage detecting circuit 7 comprises a voltage dividing circuit 71, a first determination circuit 72, a second determination circuit 73, and an AND circuit 74. A voltage supplied to the control terminal of the voltage drive switching device 1 is detected by the voltage dividing circuit 71. Here, resistors employed in the voltage dividing circuit 71 are preferably sufficiently large, and the voltage division ratio is preferably 1:10 or more. The first determination circuit 72 and the second determination circuit 73 determine the control voltage detected by the voltage dividing circuit 71 with reference to a first reference voltage 703 and a second reference voltage 704, respectively (i.e., determine whether the control voltage is larger or smaller than the reference voltage), and output the results. Here, the first reference voltage 703 and the second reference voltage 704 are set so that one of them is lower than the threshold voltage of the voltage drive switching device 1, while the other is higher than the threshold voltage. The first reference voltage 703 and the second reference voltage 704 are desirably set to be within ±10% of the threshold voltage.

Figure 13:
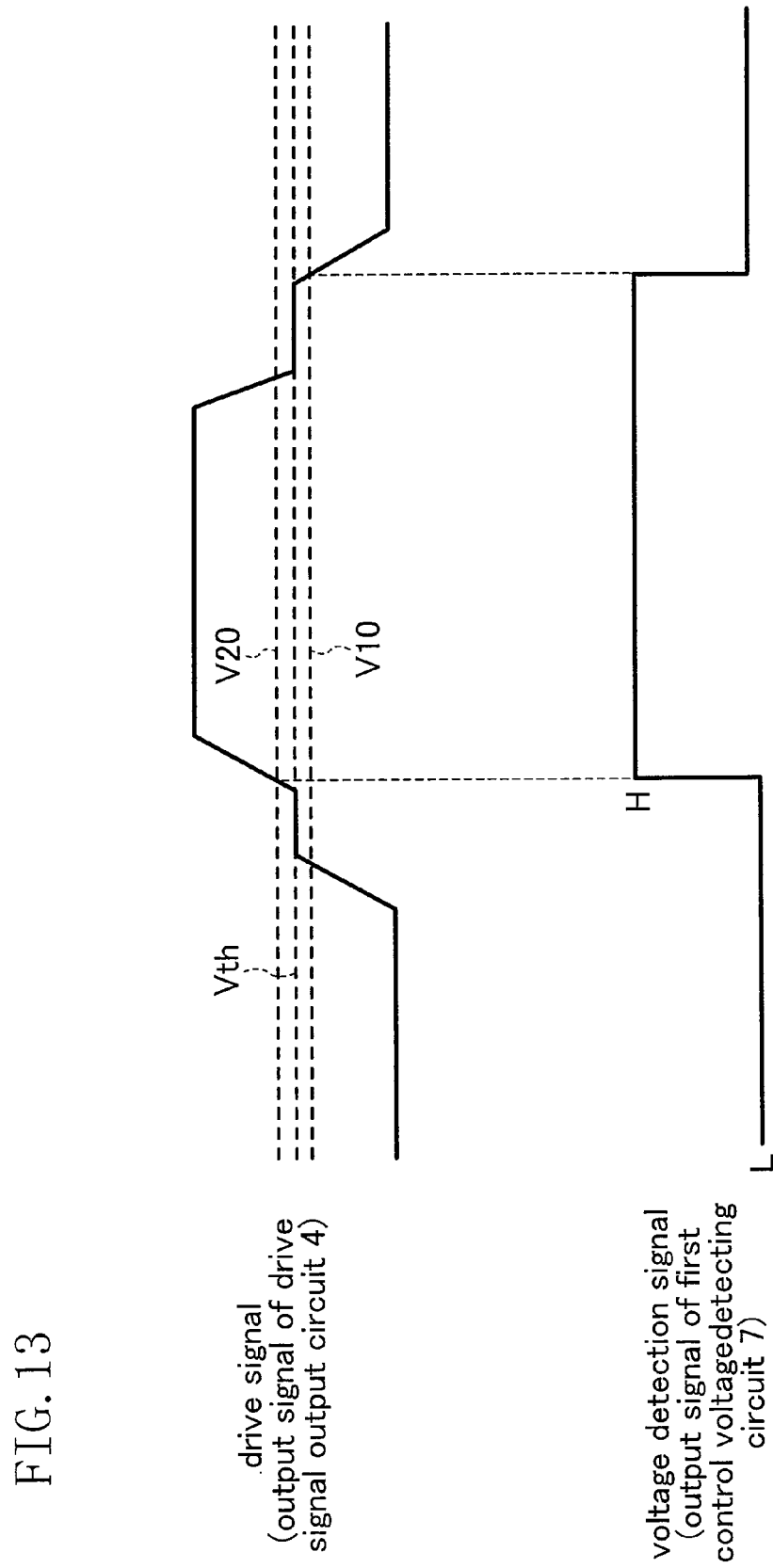
FIG. 13 is a timing chart showing a waveform of a drive voltage output from a drive signal output circuit included in the switching device drive circuit of FIG. 9.

Next, detection timing will be described in detail with reference to FIG. 13. FIG. 13 shows operation waveforms of a drive signal, and a detection signal obtained by the control voltage detecting circuit 7.

In FIG. 13, the threshold voltage of the voltage drive switching device 1 is represented by Vth, and the first reference voltage and the second reference voltage of the control voltage detecting circuit 7 are represented by V10 and V20, respectively. When the voltage drive switching device 1 is turned ON, the outputs of the first determination circuit 72 and the second determination circuit 73 are instantaneously switched from the Low level to the High level when reaching the voltage V10 and the voltage V20, respectively. When the voltage drive switching device 1 is turned OFF, the outputs of the first determination circuit 72 and the second determination circuit 73 are instantaneously switched from the High level to the Low level when reaching the voltage V10 and the voltage V20, respectively. Therefore, the output level of the detection signal output by the control voltage detecting circuit 7 is switched upon the end of the mirror effect, both when the voltage drive switching device 1 is turned ON and when the voltage drive switching device 1 is turned OFF. Therefore, for a period from the input of the PWM signal to the end of the mirror effect, the voltage output by the control voltage detecting circuit 7 is changed so that a delay time is reduced or a switching loss is reduced.

Thus, by detecting the control voltage using resistance voltage division and outputting a detection signal using the determination circuit employing two reference voltages, times when the mirror effect is ended during a turning-ON operation and a turning-OFF operation can be easily and reliably detected.

Next, operation waveforms in the switching device drive circuit 2 and the voltage drive switching device 1 of FIG. 9 will be described with reference to FIG. 14. In FIG. 14, a PWM signal, a drive signal, a drain current, a drain voltage, a detection signal, an ON-control voltage, and an OFF-control voltage are an output signal of the PWM pulse output circuit 3, an output signal of the switching device drive circuit 2, a drain voltage and a drain current of the voltage drive switching device 1, an output signal of the first control voltage detecting circuit 7, an output voltage of the OFF-control voltage circuit 5, and an output voltage of the OFF-control voltage circuit 6.

As can be seen from FIG. 14, the drive signal is output from the drive signal output circuit 4 in accordance with the H-level PWM signal output the PWM pulse output circuit 3 for turning ON/OFF the voltage drive switching device 1, i.e., the drive signal is output only for a predetermined period during which the transition of the PWM signal to the H level is started, the PWM signal goes to the L level, and thereafter, the drive signal returns to the voltage value. Here, a time from the start of transition of the PWM signal to the H level to the start of actual increase of the voltage of the drive signal is a delay time of the operation of the drive signal output circuit 4. Hereinafter, its detail will be described.

Initially, the PWM pulse output circuit 3 outputs the PWM signal for turning ON/OFF the voltage drive switching device 1. The PWM signal is instantaneously switched from the Low level to the High level at time t1' in FIG. 14, and is instantaneously switched from the High level to the Low level at time t5'. Next, the PWM signal is power-amplifies by the switching device drive circuit 2 and is then input as a drive signal to the control terminal of the voltage drive switching device 1. The drive signal is operated in synchronization with the PWM signal.

The turning-ON operation of the voltage drive switching device 1 will be described in detail. At time t1', the PWM signal goes to the High level, and the ON-control voltage circuit 5 outputs a voltage V2 that is higher than a predetermined voltage V1b of a stationary state. Rising of the drive signal is delayed to time t2' due to a delay caused by a circuit in the switching device drive circuit 2 or current limitation caused by the control resistor. However, since the boosted voltage V2 output by the ON-control voltage circuit 5 is higher than the predetermined voltage V1 of the stationary state, a current flowing into the control terminal of the voltage drive switching device 1 can be increased. Therefore, a turning-ON delay time from time t1' to time t2' can be reduced.

From time t2', charging of the gate-source capacitance (not shown) of the voltage drive switching device 1 is started, so that the drive signal (i.e., the voltage of the control terminal) gradually increases. At time t3', the drive signal reaches the threshold voltage of the voltage drive switching device 1, so that the voltage drive switching device 1 is turned ON, whereby charging of the drain-gate capacitance (not shown) is started in addition to the gate-source capacitance. Until time t4' at which charging is substantially completed, the drive signal is clamped in the vicinity of the threshold voltage. Also in this charging operation, the ON-control voltage circuit 5 outputs the boosted voltage V2 higher than the predetermined voltage V1 of the stationary state, so that the charging operation is quickly completed, and therefore, a time for which the drive signal is clamped in the vicinity of the threshold voltage is reduced. After time t4', the detection signal output from the first control voltage detecting circuit 7 is instantaneously switched from the Low level to the High level, and in response to this, the output voltage of the ON-control voltage circuit 5 is changed from the boosted voltage V2 back to the predetermined voltage V1 of the stationary state. The voltage of the drive signal gradually increases and reaches the predetermined voltage V1 of the stationary state output by the ON-control voltage circuit 5, and the turning-ON operation is ended. In the voltage drive switching device 1, the drain current starts flowing at time t3', and the desired drain current flows and the drain voltage is in the stationary state at time t4'. As described above, a period of time t3' to t4' is reduced, so that the operation time of the drain current and the drain voltage is also reduced.

Next, the turning-OFF operation of the voltage drive switching device 1, i.e., a final portion of the predetermined period after the transition of the PWM signal to the Low level, will be described in detail. At time t5', the PWM signal goes to the Low level, and the OFF-control voltage circuit 6 outputs the dropped voltage V4 that is lower than the predetermined voltage V3 of the stationary state. As in the turning-ON operation, rising of the drive signal is delayed to time t6' due to a delay caused by a circuit in the switching device drive circuit 2 or a current limitation caused by the control resistor. However, since the dropped voltage V4 output from the OFF-control voltage circuit 6 is lower than the predetermined voltage V3 of the stationary state, a current flowing out from the control terminal of the voltage drive switching device 1 can be increased. Therefore, a turning-OFF delay time from time t1' to time t2' can be reduced.

From time t6', discharging is started from the gate-source capacitance and the drain-gate capacitance of the voltage drive switching device 1, so that the drive signal (i.e., the voltage of the control terminal) gradually increases. At time t7', the drive signal reaches the threshold voltage of the voltage drive switching device 1, so that the voltage drive switching device 1 is turned OFF, whereby only the gate-source capacitance continues to be discharged. By this operation, also as in the turning-ON operation, the drive signal is clamped in the vicinity of the threshold voltage until time t8' at which discharging is substantially completed. Also in this discharging operation, since the OFF-control voltage circuit 6 outputs the dropped voltage V4 that is lower than the predetermined voltage V3 of the stationary state, the discharging operation is quickly completed, so that a time for which the drive signal is clamped in the vicinity of the threshold voltage is reduced. After time t8', the detection signal output from the first control voltage detecting circuit 7 is instantaneously switched from the High level to the Low level, and in response to this, the output voltage of the OFF-control voltage circuit 6 is changed from the dropped voltage V4 back to the predetermined voltage V3 of the stationary state. From time t8', the output voltage of the OFF-control voltage circuit 6 gradually decreases and reaches the OFF-control voltage output by the OFF-control voltage circuit 6, and the turning-OFF operation is ended. In the voltage drive switching device 1, the drain current starts flowing from time t7', and the desired drain current flows and the drain voltage is in the stationary state at time t8'. As described above, a period from time t7' to t8' is reduced, and the operation time of the drain current and the drain voltage is also reduced.

Therefore, when the ON-control voltage (OFF-control voltage) is higher (lower) than the voltage of the stationary state until the start of the mirror effect, a delay time during the turning-ON (turning-OFF) operation can be significantly reduced. Therefore, in a power converter, such as an inverter or a converter, a dead time (also called a rest period) in which both the upper and lower arms (switching devices connected in series to a power supply) are OFF, can be significantly reduced, thereby making it possible to suppress a current distortion or the like occurring due to an influence of the dead time.

Moreover, when the ON-control voltage (OFF-control voltage) is set to be higher (lower) than the voltage of the stationary state until the end of the mirror effect, a switching operation during the turning-ON (turning-OFF) operation can be made quicker and the switching loss can be reduced.

Note that the range of voltages output by the ON-control voltage circuit 5 and the OFF-control voltage circuit 6 is desirably about 1.5 to 2.0 times higher than the output voltage of the stationary state. The output voltage range may differ between the ON-control voltage circuit 5 and the OFF-control voltage circuit 6. Only one of the output voltages of the ON-control voltage circuit 5 and the OFF-control voltage circuit 6 may be changed, depending on the control voltage. Also, the output voltage may be changed either instantaneously or gradually, or may be changed a plurality of times in a stepwise manner. Moreover, the output voltage and the voltage of stationary state may be switched at a high frequency.

(Variation of ON-Control Voltage Circuit and OFF-Control Voltage Circuit)

Next, in the switching device drive circuit of FIG. 9, other operations of the ON-control voltage circuit 5 and the OFF-control voltage circuit 6 will be described with reference to FIG. 15.

Figure 15:
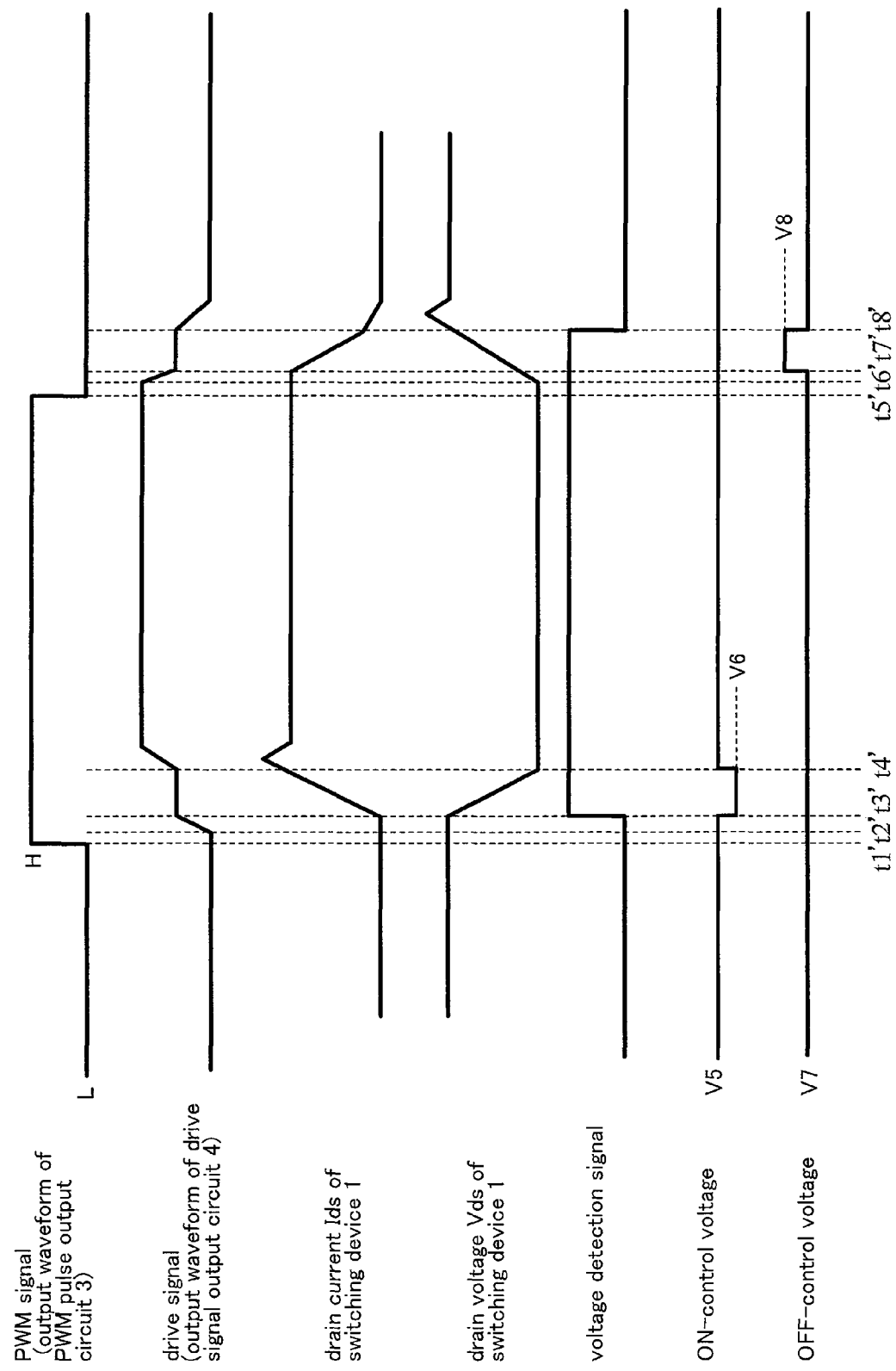
FIG. 15 is a timing chart showing signals of main components of variations of the ON-control voltage circuit and the OFF-control voltage circuit included in the switching device drive circuit of FIG. 9.

FIG. 15 shows operation waveforms of the switching device drive circuit 2 and the voltage drive switching device 1 of FIG. 9.

The embodiment in which the control voltage is changed for a period from the input of the PWM signal until the end of the mirror effect has been described with reference to the operation waveforms of FIG. 14. In this variation, the control voltage is changed only during a period of the mirror effect. Specifically, as shown in FIG. 15, the control voltage output by the ON-control voltage circuit 5 is decreased from a predetermined voltage V5 to a dropped voltage V6 only for a period from time t3' to t4' in the turning-ON operation. Also, in the turning-OFF operation, the control voltage output by the OFF-control voltage circuit 6 is increased from a predetermined voltage V7 to a boosted voltage V8 only for a period from time t7' to time t8'.

Thereby, the switching rate can be caused to be gentle without increasing a delay time in the turning-ON operation and the turning-OFF operation. Therefore, a current distortion due to a delay time can be suppressed, so that a surge voltage and noise can be reduced.

Third Embodiment

Next, a third embodiment of the present invention will be described.

In this embodiment, the whole configuration of a switching device drive circuit is the same as that of FIG. 9. The switching device drive circuit of this embodiment is different from that of FIG. 9 by the configuration of the first control voltage detecting circuit 7. The configuration of a first control voltage detecting circuit and an operation of the switching device drive circuit of this embodiment will be described with reference to FIGS. 16 and 17.

Figure 16:
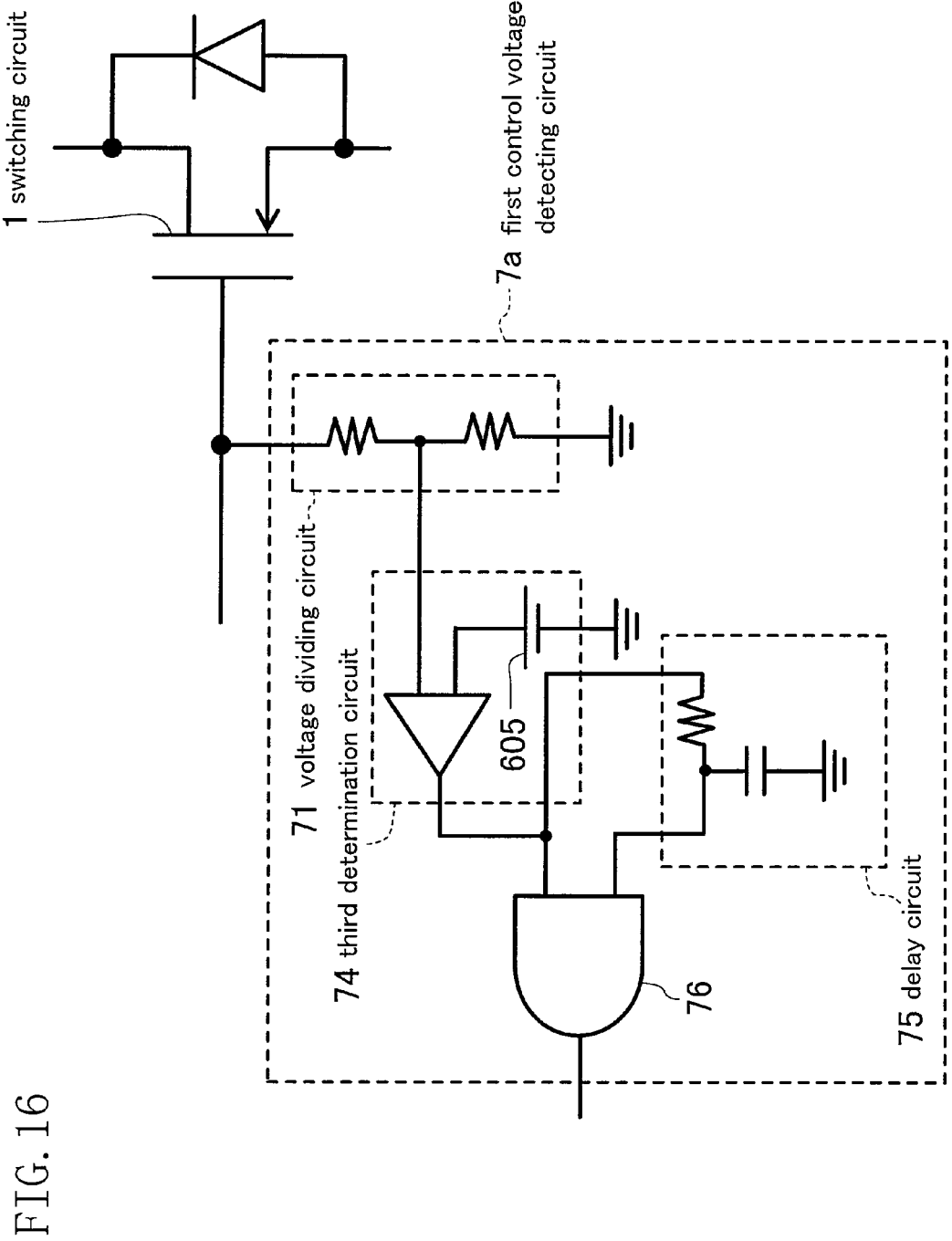
FIG. 16 is a block diagram showing an internal configuration of a first control voltage detecting circuit included in a switching device drive circuit according to a third embodiment of the present invention.
Figure 17:
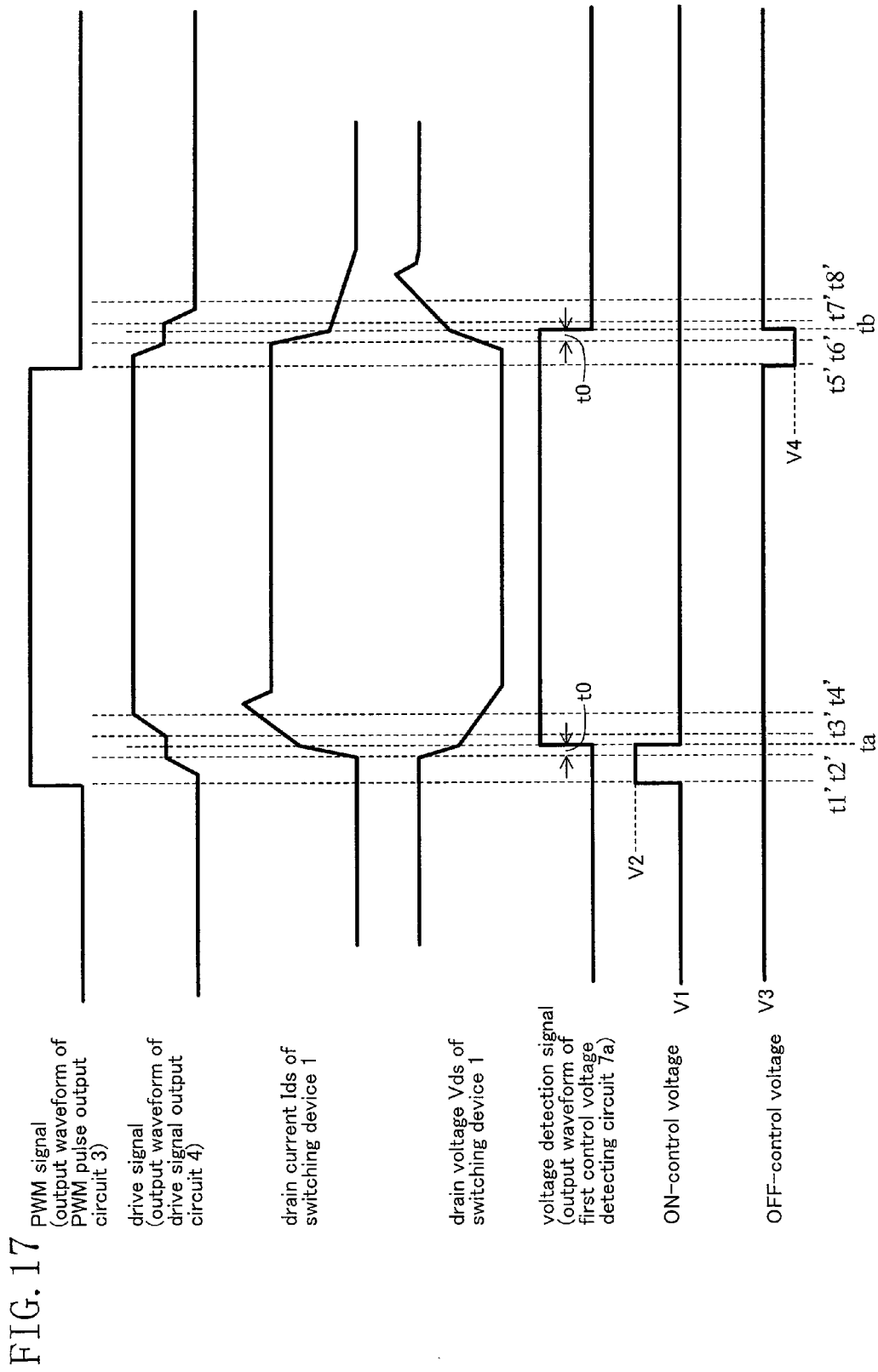
FIG. 17 is a timing chart showing signals of main components of the switching device drive circuit of FIG. 16.

FIG. 16 is a diagram showing an exemplary first control voltage detecting circuit 7a. FIG. 17 is a diagram showing operation waveforms when the control voltage detecting circuit 7a is employed in the switching device drive circuit 2.

In FIG. 16, the control voltage detecting circuit 7a comprises a voltage dividing circuit 71, a third determination circuit 74, a delay circuit 75, and an AND circuit 76.

The third determination circuit 74 compares a drive signal that is obtained by voltage division of the voltage dividing circuit 71 and is then detected, with a third reference voltage 605, and outputs the result of comparison. Here, the third reference voltage 605 is desirably the threshold voltage of the voltage drive switching device 1. The delay circuit 75 outputs an output signal of the third determination circuit 74 that is delayed by a set time t0. The delay time t0 is determined by a resistor and a capacitor included in a delay circuit, and is desirably within a mirror effect period.

Next, operation waveforms when the control voltage detecting circuit 7a of FIG. 16 is used to drive the voltage drive switching device 1 will be described with reference to FIG. 17. In FIG. 17, a PWM signal, a drive signal, a drain current, a drain voltage, a detection signal, an ON-control voltage, and an OFF-control voltage are an output signal of the PWM pulse output circuit 3, an output signal of the switching device drive circuit 2, a drain voltage and a drain current of the voltage drive switching device 1, an output signal of the first control voltage detecting circuit 7a, an output voltage of the OFF-control voltage circuit 5, and an output voltage of the OFF-control voltage circuit 6, respectively.

A main operation is the same as that which has been described with reference to FIG. 14. A difference is that an operation timing of the detection signal is within a mirror effect period from the PWM signal to the drive signal.

As shown in FIG. 17, in the turning-ON operation, the ON-control voltage is changed from the boosted voltage V2 back to the predetermined voltage V1 during a time to between time t2' and time t3' of the mirror effect period, and thereafter, the change rates of the drain current and the drain voltage are gentle, so that a surge current and noise occurring in a switching operation can be reduced. Also in the turning-OFF operation, the OFF-control voltage is changed from the dropped voltage V4 back to the predetermined voltage V3 during a time tb between time t6' and time t7' of the mirror effect period, and thereafter, the change rates of the drain current and the drain voltage are gentle, so that a surge current and noise occurring in a switching operation can be reduced.

(Variation of Control Voltage Detecting Circuit)

Moreover, another variation of the control voltage detecting circuit will be described.

Figure 18:
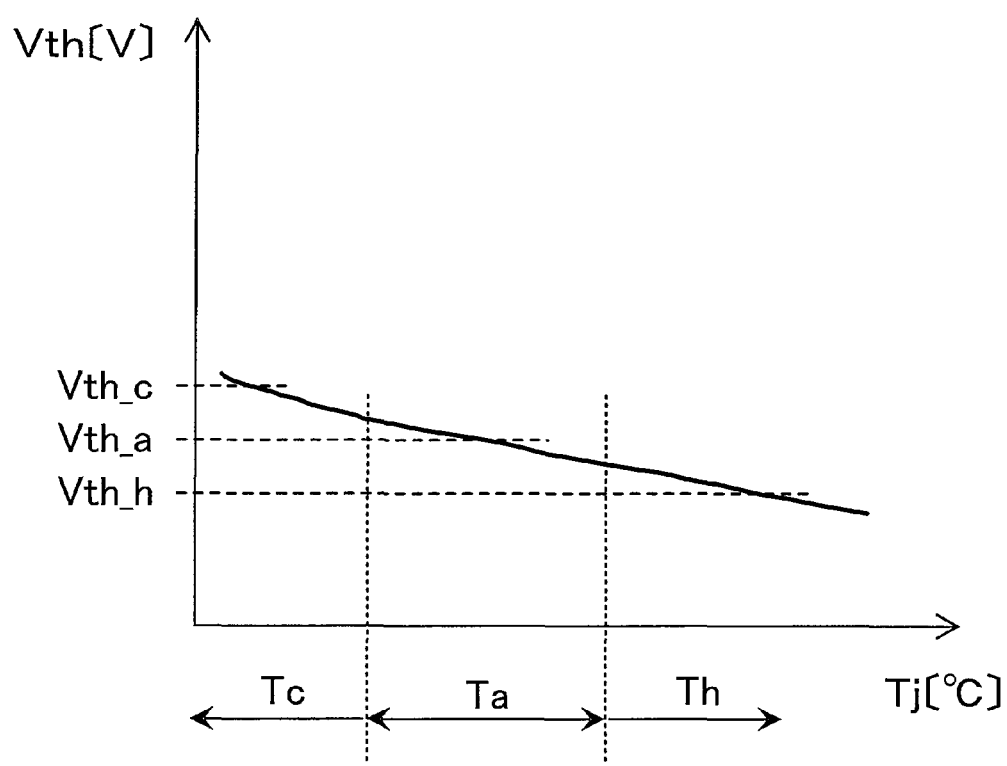
FIG. 18 is a diagram showing temperature characteristics of a threshold voltage of a switching device driven by the switching device drive of the present invention.

FIG. 18 is a diagram showing temperature characteristics of a threshold voltage Vth of the voltage drive switching device 1.

The threshold voltage Vth of the voltage drive switching device 1 is typically set to be 2 to 5 (V), and it is known that the threshold voltage Vth varies depending on temperature. The threshold voltage Vth is typically 2 to 5 (V) at room temperature (region Ta in FIG. 18), has a voltage value higher at low temperature (region Tc in FIG. 18) than that at room temperature, and has a voltage value lower at high temperature (region Th in FIG. 18) than that at room temperature. The threshold voltage Vth also has linear characteristics, depending on temperature. Therefore, when the first reference voltage, the second reference voltage, and the third reference voltage are set based on a threshold voltage Vth_a at room temperature, it is difficult to perform a control so that a desired switching operation can be performed at low temperature and at high temperature. Therefore, the first reference voltage, the second reference voltage, and the third reference voltage are preferably selected and set, depending on the temperature of the voltage drive switching device 1. In this variation, in the third determination circuit 74 included in the first control voltage detecting circuit 7a of FIG. 16, the third reference voltage 605 that is set as the threshold voltage of the voltage drive switching device 1 is selected and set, depending on temperature as described above.

Thereby, an optimal control voltage can be controlled, depending on the temperature state of the voltage drive switching device 1, thereby making it possible to further reduce a surge voltage and noise.

Fourth Embodiment

Next, a switching device drive circuit according to a fourth embodiment of the present invention will be described with reference to FIG. 19.

Figure 19:
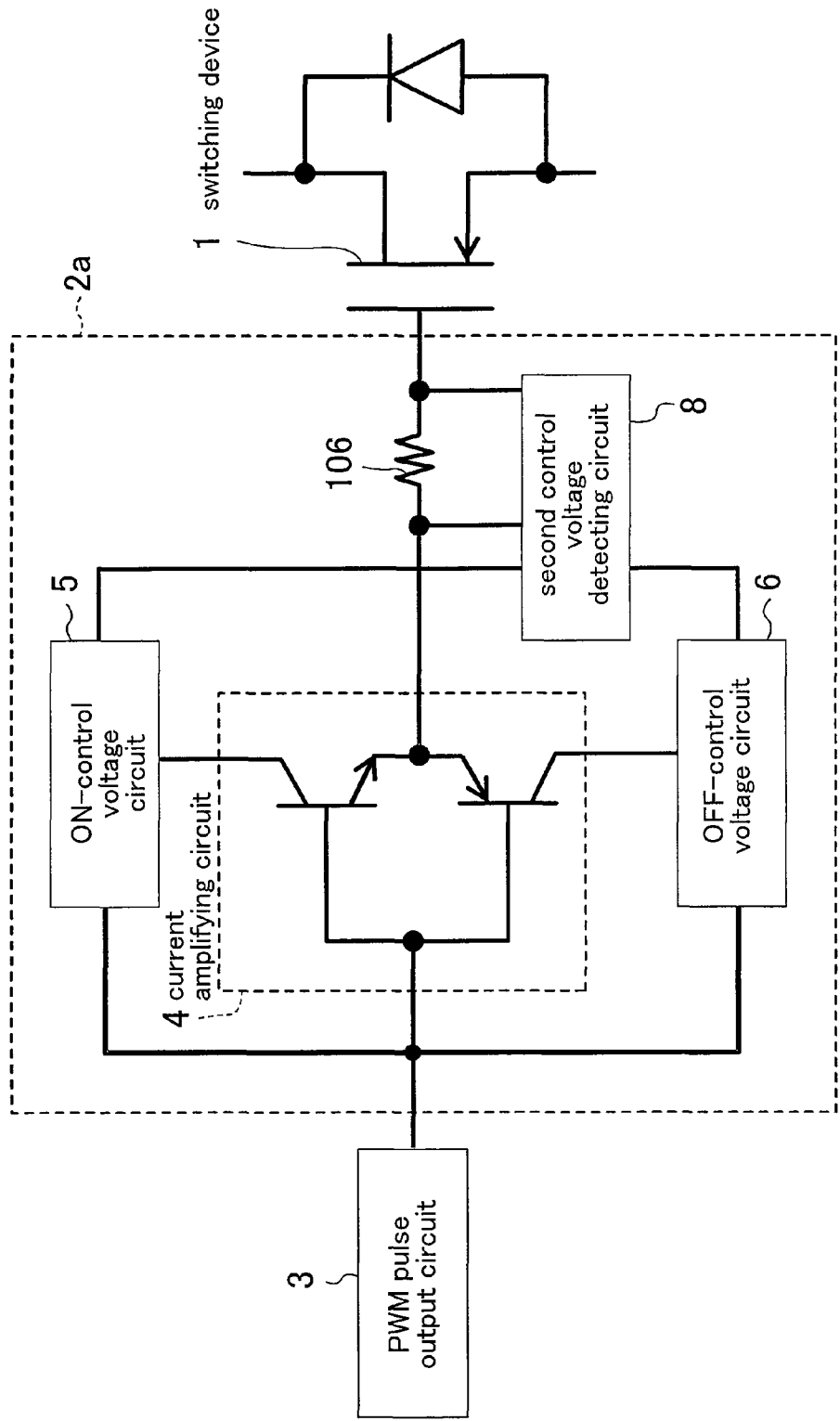
FIG. 19 is a block diagram schematically showing a configuration of a switching device drive circuit according to a fourth embodiment of the present invention.
Figure 20:
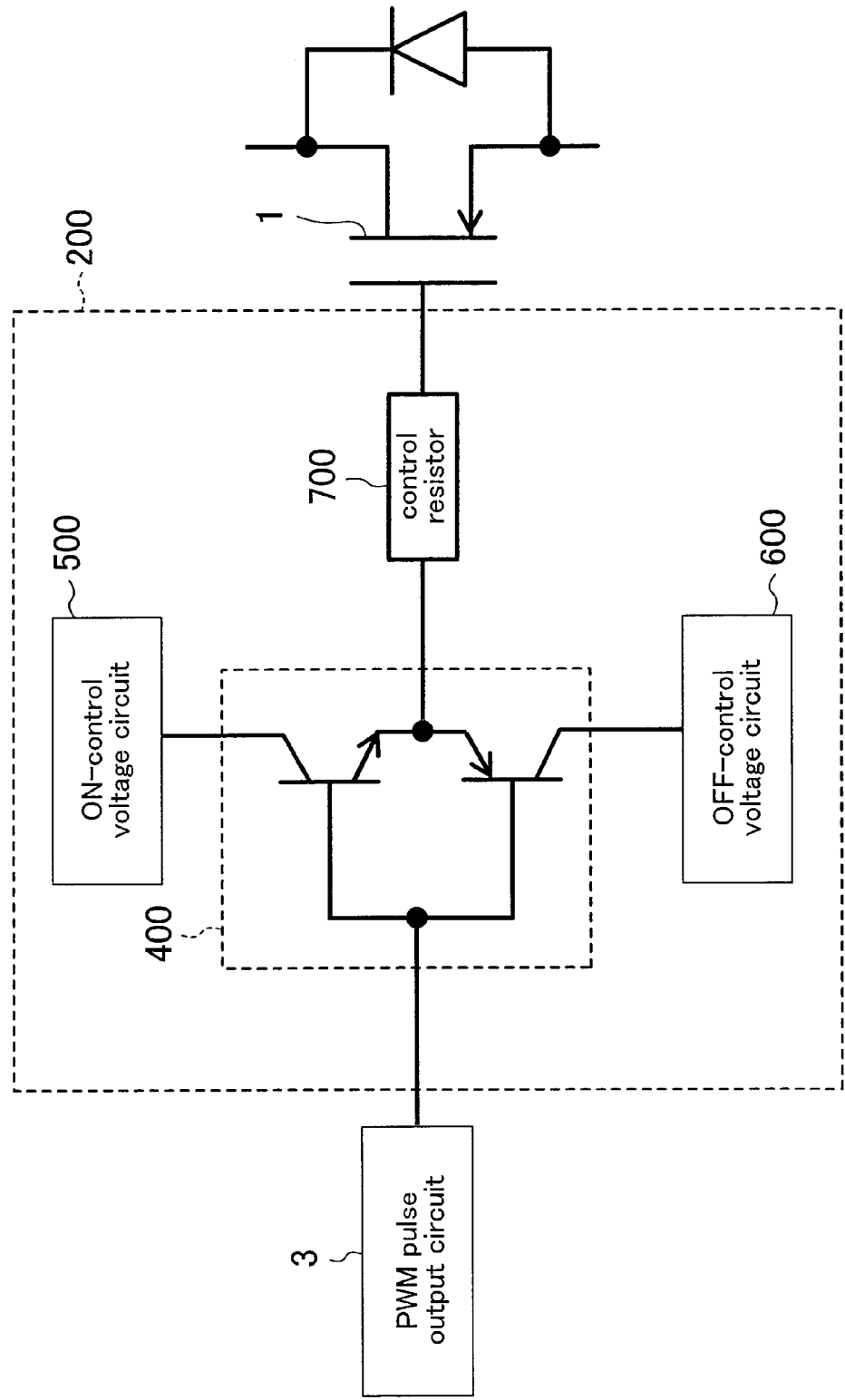
FIG. 20 is a block diagram schematically showing a conventional switching device drive circuit.
Figure 21:
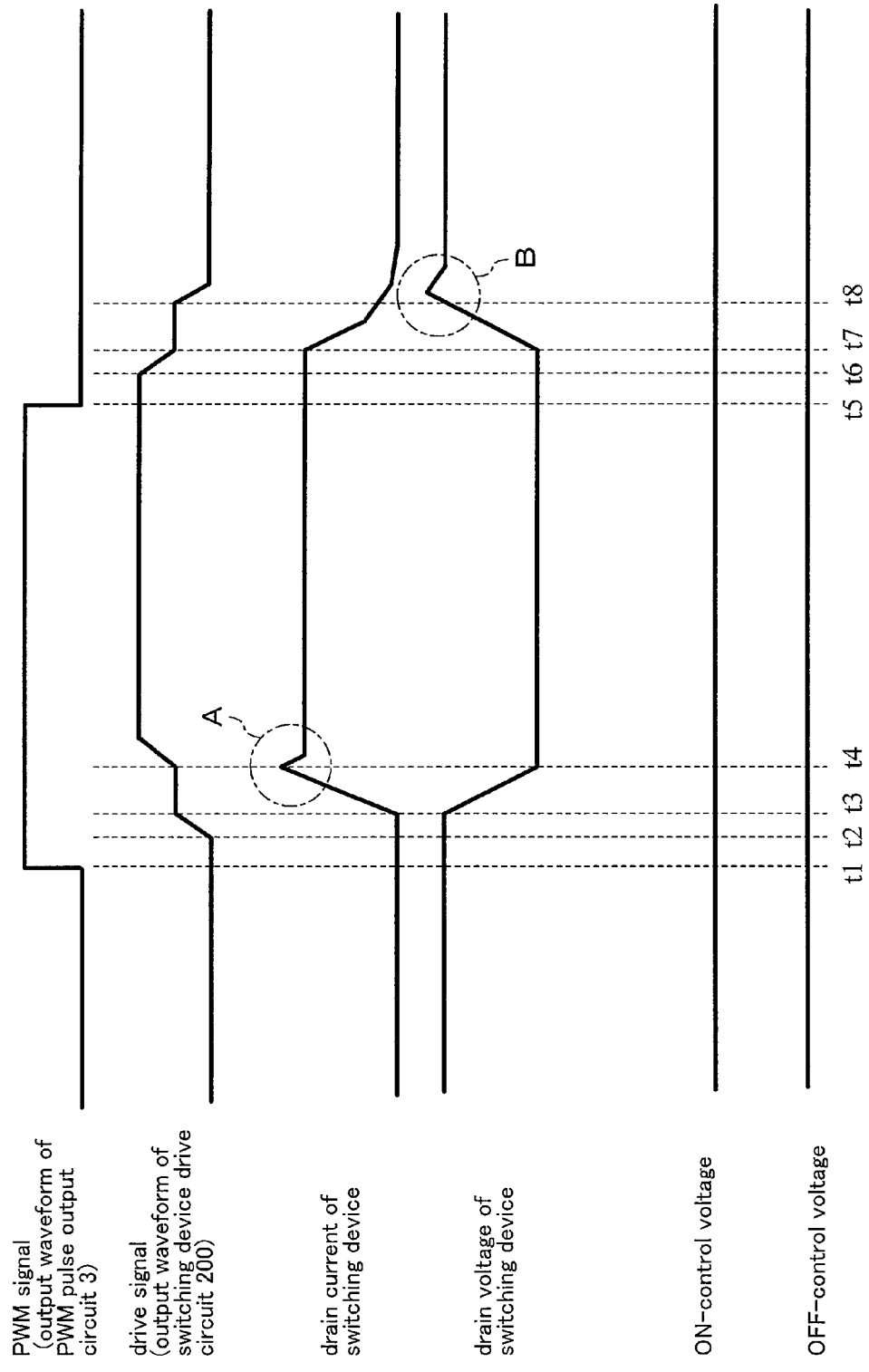
FIG. 21 is a timing chart showing signals of main components of a conventional switching device drive circuit.

FIG. 19 is a diagram showing a configuration of a switching device drive circuit according to this embodiment.

In FIG. 19, the switching device drive circuit 2a outputs a drive signal for performing a switching operation with respect to the voltage drive switching device 1, depending on a PWM signal of a PWM pulse output circuit 3. Here, the drive signal and the PWM signal are synchronous. The switching device drive circuit 2a comprises a drive signal output circuit 4, an ON-control voltage circuit 5, an OFF-control voltage circuit 6, a control resistor 106, and a second control voltage detecting circuit 8.

In this embodiment, FIG. 19 is different from FIG. 9 in that the first control voltage detecting circuit is replaced with the second control voltage detecting circuit 8, and the control resistor 106 is added.

In FIG. 19, an output of the PWM pulse output circuit 3 is connected to an input of the switching device drive circuit 2a, and an output of the switching device drive circuit 2a is connected to a control terminal of the voltage drive switching device 1. The switching device drive circuit 2a comprises a drive signal output circuit 4, an ON-control voltage circuit 5, an OFF-control circuit 6, and a control resistor 106. The drive signal output circuit 4 is synchronous with the PWM signal output from the PWM pulse output circuit 3, and outputs a power-amplified signal via the control resistor 106 to the control terminal of the voltage drive switching device 1.

The second control voltage detecting circuit 8 outputs a voltage detection signal, depending on a voltage difference between a first control voltage (at one end closer to the control terminal of the switching device) and a second control voltage (at the other end farther to the control terminal of the switching device) that are detected at both ends of the control resistor 106.

The detection of the voltage difference of the control resistor 106 is equivalent to the detection of a control current flowing into the control terminal of the voltage drive switching device 1. Here, the control current varies along with the control voltage, and substantially no control current flows when the mirror effect is ended (not shown). Therefore, by detecting the voltage difference between the first control voltage and the second control voltage (i.e., the control current), an effect similar to that of the above-described embodiments can be obtained. Therefore, a surge voltage and noise occurring during a switching operation can be reduced.

Also, when a switching device including SiC and GaN is used in a power converter, such as an inverter, a converter or the like, the switching device can withstand a high voltage and highly resist destruction than conventional Si-based switching devices, thereby making it possible to provide a switching operation having a higher speed.

INDUSTRIAL APPLICABILITY

As described above, the present invention can suppress a switching loss in a switching device and can reduce the size and cost of a voltage converting device or the like. Therefore, the present invention is, for example, useful as a switching device drive circuit for driving a switching device, such as an IGBT, a MOSFET or the like, that switches large power.

The invention claimed is:

1. A switching device drive circuit for receiving a pulse signal, and outputting a drive signal to a control terminal of a switching device including a power converting circuit for a predetermined period corresponding to the pulse signal, the switching device drive circuit comprising:
   a control circuit for changing a voltage supplied or a current flowing, as a drive signal, to or through the control terminal of the switching device, to a voltage or a current different from a predetermined voltage or a predetermined current; and
   a control voltage detecting circuit for detecting a voltage of the control terminal of the switching device,
   wherein the control circuit receives a voltage detection signal of the control voltage detecting circuit, and depending on a voltage value of the control terminal of the switching device, changes the voltage supplied or the current flowing, as the drive signal, to or through the control terminal of the switching device, to a voltage or a current having a larger value than that of the predetermined voltage or the predetermined current, for a constant period including a portion of a mirror effect period during turning ON of the switching device, as a portion of the predetermined period corresponding to the pulse signal.

2. The switching device drive circuit of claim 1, wherein the switching device is formed of a wide band gap semiconductor including SiC or GaN.

3. The switching device drive circuit of claim 1, wherein the control circuit has a boosting/dropping circuit for booting or dropping the predetermined voltage, and
   the boosting/dropping circuit, when receiving the voltage detection signal of the control voltage detecting circuit, changes the voltage supplied or the current flowing, as the drive signal, to or through the control terminal of the switching device, to a voltage or a current having a value larger than that of the predetermined voltage or the predetermined current.

4. The switching device drive circuit of claim 1, wherein the control voltage detecting circuit detects, as the voltage of the control terminal of the switching device, a state of less than a predetermined voltage lower than or equal to a threshold voltage of the switching device, and outputs the voltage detection signal when detecting the state of less than the predetermined voltage, and
   the control circuit, when receiving the voltage detection signal of the control voltage detecting circuit, changes the voltage supplied or the current flowing, as the drive signal, to or through the control terminal of the switching device, to a value larger than the predetermined voltage or the predetermined current, and when no longer receiving the voltage detection signal, stops changing the voltage or the current to the larger value.

5. The switching device drive circuit of claim 4, wherein the threshold voltage of the switching device in the control voltage detecting circuit is corrected, depending on temperature.

6. The switching device drive circuit of claim 5, wherein the threshold voltage of the switching device in the control voltage detecting circuit is corrected to be higher as a temperature of the switching device decreases, and is corrected to be lower as the temperature of the switching device increases.

7. The switching device drive circuit of claim 1, wherein the control circuit changes the voltage supplied or the current flowing, as the drive signal, to or through the control terminal of the switching device, for a period from start of the predetermined period to end of a mirror effect period during turning ON of the switching device, as the portion of the predetermined period corresponding to the pulse signal.

8. The switching device drive circuit of claim 7, wherein
the control circuit has an ON-control voltage circuit for changing a voltage of a drive signal supplied to the control terminal during turning ON of the switching device, to a voltage higher than a predetermined voltage for turning ON,
the control voltage detecting circuit detects, as the voltage of the control terminal of the switching device, a voltage value higher than a threshold voltage of the switching device by a predetermined voltage, and outputs the voltage detection signal to the ON-control voltage circuit of the control circuit when the voltage value higher by the predetermined voltage is detected, and
the ON-control voltage circuit changes the voltage supplied as the drive signal to the control terminal of the switching device to the voltage higher than the predetermined voltage for turning ON during start of the predetermined period corresponding to the pulse signal, and when receiving the voltage detection signal of the control voltage detecting circuit, stops changing to the higher voltage.

9. The switching device drive circuit of claim 1, wherein
the control circuit changes the voltage supplied or the current flowing, as the drive signal, to or through the control terminal of the switching device, for a period including a mirror effect period during turning OFF of the switching device, as the portion of the predetermined period corresponding to the pulse signal.

10. The switching device drive circuit of claim 9, wherein
the control circuit has an OFF-control voltage circuit for changing a voltage supplied as a drive signal to the control terminal during turning OFF of the switching device, to a voltage lower than a predetermined voltage for turning OFF,
the control voltage detecting circuit detects, as the voltage of the control terminal of the switching device, a voltage value lower than a threshold voltage of the switching device by a predetermined voltage, and outputs the voltage detection signal to an OFF-control voltage circuit of the control circuit when the voltage value lower by the predetermined voltage is detected, and
the OFF-control voltage circuit, when no longer receiving the pulse signal, changes the voltage supplied as the drive signal to the control terminal of the switching device to the voltage lower than the predetermined voltage for turning OFF, and when receiving the voltage detection signal of the control voltage detecting circuit, stops changing to the lower voltage.

11. The switching device drive circuit of claim 1, wherein
the control circuit changes the voltage supplied or the current flowing, as the drive signal, to or through the control terminal of the switching device, for a period including a whole mirror effect period of the switching device, as the portion of the predetermined period corresponding to the pulse signal.

12. The switching device drive circuit of claim 11, wherein
the control circuit has an ON-control voltage circuit for changing a voltage supplied as a drive signal to the control terminal, to a voltage lower than a predetermined voltage for turning ON, for a period including a whole mirror effect period of the switching device, during turning ON of the switching device.

13. The switching device drive circuit of claim 11, wherein
the control circuit has an OFF-control voltage circuit for changing a voltage supplied as a drive signal to the control terminal, to a voltage higher than a predetermined voltage for turning OFF, for a period including a whole mirror effect period of the switching device, during turning OFF of the switching device.

14. The switching device drive circuit of claim 1, wherein
the control circuit changes the voltage supplied or the current flowing, as the drive signal, to or through the control terminal of the switching device, for a period from start of the predetermined period to an intermediate point of the mirror effect period during turning ON of the switching device, as the portion of the predetermined period corresponding to the pulse signal.

15. The switching device drive circuit of claim 14, wherein
the control circuit has an ON-control voltage circuit for changing a voltage supplied as a drive signal to the control terminal during turning ON of the switching device, to a voltage higher than a predetermined voltage for turning ON,
the control voltage detecting circuit detects, as the voltage of the control terminal of the switching device, a threshold voltage of the switching device, and after the detection of the threshold voltage, outputs the voltage detection signal to the ON-control voltage circuit of the control circuit after lapse of a predetermined set time, and
the ON-control voltage circuit changes the voltage supplied as the drive signal to the control terminal of the switching device to a voltage higher than the predetermined voltage for turning ON during start of the predetermined period corresponding to the pulse signal, and when receiving the voltage detection signal of the control voltage detecting circuit, stops changing to the higher voltage.

16. The switching device drive circuit of claim 1, wherein
the control circuit changes the voltage supplied or the current flowing, as the drive signal, to or through the control terminal of the switching device, for a period from end of reception of the pulse signal to an intermediate point of the mirror effect period during turning OFF of the switching device, as the portion of the predetermined period corresponding to the pulse signal.

17. The switching device drive circuit of claim 16, wherein
the control circuit has an OFF-control voltage circuit for changing a voltage supplied as a drive signal to the control terminal during turning OFF of the switching device, to a voltage lower than a predetermined voltage for turning OFF,
the control voltage detecting circuit detects, as the voltage of the control terminal of the switching device, a predetermined voltage value less than a threshold voltage of the switching device, and after the detection of the predetermined voltage value, outputs the voltage detection signal to the OFF-control voltage circuit of the control circuit after lapse of a predetermined set time, and
the OFF-control voltage circuit changes the voltage supplied as the drive signal to the control terminal of the switching device to a voltage lower than the predetermined voltage for turning OFF at end of reception of the pulse signal, and when receiving the voltage detection signal of the control voltage detecting circuit, stops changing to the lower voltage.

18. A switching device drive circuit for receiving a pulse signal, and outputting a drive signal to a control terminal of a switching device including a power converting circuit for a predetermined period corresponding to the pulse signal, the switching device drive circuit comprising:
- a control circuit for changing a voltage or a current of a drive signal supplied to the control terminal of the switching device, to a voltage or a current different from a predetermined voltage or a predetermined current;
- a control resistor connected to the control terminal of the switching circuit; and
- a control voltage detecting circuit for detecting a voltage of both ends of the control resistor,
- wherein the control circuit receives a voltage detection signal from the control voltage detecting circuit, and depending on the voltage of both the ends of the control resistor, changes the voltage or the current of the drive signal supplied to the control terminal of the switching device, to a voltage or a current different from the predetermined voltage or the predetermined current, only for a portion of a predetermined period corresponding to the pulse signal.

19. The switching device drive circuit of claim 18, wherein the control circuit largely changes the voltage or the current of the drive signal supplied to the control terminal of the switching device, for a period from start of the predetermined period to when a detected voltage difference of both the ends of the control resistor is zero, as the portion of the predetermined period corresponding to the pulse signal.

* * * * *